United States Patent
Fujita et al.

(10) Patent No.: US 8,426,931 B2
(45) Date of Patent: Apr. 23, 2013

(54) SEMICONDUCTOR DEVICE AND METHOD OF FABRICATING THE SEMICONDUCTOR DEVICE

(75) Inventors: Toma Fujita, Kyoto (JP); Hironobu Kawauchi, Kyoto (JP); Haruhiko Nishikage, Kyoto (JP)

(73) Assignee: Rohm Co., Ltd., Kyoto-fu (JP)

( * ) Notice: Subject to any disclaimer, the term of this patent is extended or adjusted under 35 U.S.C. 154(b) by 185 days.

(21) Appl. No.: 12/907,252

(22) Filed: Oct. 19, 2010

(65) Prior Publication Data
US 2011/0089503 A1 Apr. 21, 2011

(51) Int. Cl.
*H01L 29/84* (2006.01)

(52) U.S. Cl.
USPC ........... 257/415; 257/414; 257/417; 257/419; 257/925; 257/E23.013; 257/E23.17; 257/E29.324

(58) Field of Classification Search .................. 257/414, 257/415, 417, 419, 925, E23.013, E23.17
See application file for complete search history.

(56) References Cited

U.S. PATENT DOCUMENTS

| | | | | |
|---|---|---|---|---|
| 6,171,881 B1 * | 1/2001 | Fujii | ............................... | 438/52 |
| 6,342,430 B1 | 1/2002 | Adams et al. | | |
| 6,388,300 B1 * | 5/2002 | Kano et al. | .................... | 257/419 |
| 2004/0155556 A1 * | 8/2004 | Onoda et al. | .................. | 310/309 |

* cited by examiner

*Primary Examiner* — Michelle Mandala
(74) *Attorney, Agent, or Firm* — Fish & Richardson P.C.

(57) ABSTRACT

To provide a semiconductor device prevented from giving a limitation on the sensitivity of HEMS devices due to isolation regions thereof and a method of fabricating the same. The semiconductor device includes: a semiconductor substrate with a recess portion formed in an upper surface; a supporting body provided around the recess portion on the semiconductor substrate; a beam-type movable portion which includes a movable electrode provided above the recess portion and is fixed to the supporting body at a position away from the movable electrode; a beam-type fixed electrode provided above the recess portion to be opposed to the movable electrode and fixed to the supporting body; and isolation regions each including a separation column made of a semiconductor and a separation insulating film provided on a side surface of the separation column, the isolation regions being provided between the movable electrode and the supporting body and between the fixed electrode and the supporting body to electrically separate the movable and fixed electrodes from the supporting body.

5 Claims, 27 Drawing Sheets

SEMICONDUCTOR DEVICE AND METHOD OF FABRICATING THE SEMICONDUCTOR DEVICE

CROSS REFERENCE TO RELATED APPLICATION AND INCORPORATION BY REFERENCE

This application is based upon prior Japanese Patent Application No. P2009-183444 filed on Aug. 6, 2009, the entire contents of which are incorporated herein by reference.

TECHNICAL FIELD

The present invention relates to a semiconductor device including a movable portion and a method of fabricating the same.

BACKGROUND ART

Acceleration sensors, gyro-sensors, and the like are provided with semiconductor devices including a movable portion displaced by force externally applied (hereinafter, referred to as external force), such as MEMS (micro-electromechanical system) devices. For example, capacitive acceleration sensors which sense a change in capacitance between two beam-type oscillators to detect acceleration have been put to practical use.

In recent years, MEMS devices including an isolation region between the free end of the beam-type movable portion and a substrate supporting the movable portion have been proposed (for example, see Patent Literature 1). Specifically, a groove for isolation is formed between the free end of the movable portion and the fixed end of the movable portion fixed to the substrate. The groove is filled with an insulating material to form the isolation region electrically separating the free end of the movable portion and the substrate.

Citation List

Patent Literature 1: U.S. Pat. No. 6,342,430

SUMMARY OF THE INVENTION

Technical Problem

However, the method of forming the isolation region by filling the groove with an insulating material has a problem of limited depth and width. For example, when the etching for forming the groove of the isolation region is deep-reactive ion etching (D-RIE), the aspect ratio of the depth of the groove to the width is about 60/1. Therefore, if the width of the groove is 0.5 µm, the depth thereof is limited to about 30 µm. Accordingly, it is difficult to stably form a deep groove while maintaining the width equal to a certain value or less. Furthermore, it is difficult to uniformly fill the groove with the insulating material when the groove is deep and narrow.

Moreover, the thicker the movable portion is, the more sensitive the MEMS device. However, with the method of forming the groove for isolation to form the isolation region, the thickness of the movable portion is limited by the depth of the isolation region, and the sensitivity of the MEMS is therefore limited.

In the light of the aforementioned problems, an object of the present invention is to provide a semiconductor device prevented from giving a limitation on the sensitivity of MEMS devices due to the isolation region and a method of fabricating the semiconductor device.

Solution to Problem

According to an aspect of the present invention, a semiconductor device is provided, which includes: a semiconductor substrate with a recess portion formed in an upper surface; a supporting body provided around the recess portion on the semiconductor substrate; a beam-type movable portion which includes a movable electrode provided above the recess portion and is fixed to the supporting body at a position away from the movable electrode; a beam-type fixed electrode provided above the recess portion to be opposed to the movable electrode and fixed to the supporting body; and isolation regions each including a separation column made of a semiconductor and a separation insulating film provided on a side surface of the separation column, the isolation regions being provided between the movable electrode and the supporting body and between the fixed electrode and the supporting body to electrically separate the movable and fixed electrodes from the supporting body.

According to another aspect of the present invention, a method of fabricating a semiconductor device having a movable portion including a movable electrode and a fixed electrode opposed to the movable electrode is provided. The method includes: a step of forming isolation regions on a semiconductor substrate, each of the isolation regions including a separation column made of a semiconductor and a separation insulating film provided on a side surface of the separation column; a step of forming a burying semiconductor film on the semiconductor substrate to bury the isolation regions in the burying semiconductor film; a step of partially etching the burying semiconductor film to form side grooves in which side surfaces of the movable portion and fixed electrode are exposed so that the movable portion and the fixed electrode are connected to the supporting body with the individual isolation regions interposed therebetween, the movable portion and fixed electrode being composed of portions of the burying semiconductor film, the supporting body being composed of a portion of the burying semiconductor film provided on a peripheral region of the semiconductor substrate; a step of forming side insulating films on the side surfaces of the movable portion and the fixed electrode; and a step of forming a recess portion by partially isotropically etching upper part of the semiconductor substrate using the side insulating films as a mask to provide the movable portion and fixed electrode above the recess portion.

According to still another aspect, a method of fabricating a semiconductor device having a movable portion including a movable electrode and a fixed electrode opposed to the movable electrode is provided. The method includes: a step of preparing a laminate including a semiconductor substrate, an insulator layer, and a semiconductor layer stacked on each other; a step of partially etching the semiconductor layer to form separation grooves; a step of forming a separation insulating film on the surface of each separation groove and filling the separation groove with a semiconductor film to form isolation regions each including a separation column made of a semiconductor and the separation insulating film provided on the side surface of the separation column; a step of partially etching the semiconductor layer to form side grooves in which side surfaces of the movable portion and the fixed electrode are exposed so that the movable portion and the fixed electrode are connected to the supporting body with the individual isolation regions interposed therebetween, the movable portion and fixed electrode being composed of portions of the semiconductor layer, the supporting body being composed of a portion of the semiconductor layer provided on a peripheral region of the semiconductor substrate; a step of forming side insulating films on the side surfaces of the movable portion and the fixed electrode; and a step of forming a recess portion by partially isotropically etching upper part of the semiconductor substrate using the side insulating films as a mask to provide the movable portion and the fixed electrode above the recess portion.

Advantageous Effects of Invention

According to the present invention, it is possible to provide a semiconductor substrate prevented from giving a limitation on the sensitivity of MEMS devices due to the isolation regions and provide a method of fabricating the semiconductor device.

DESCRIPTION OF EMBODIMENTS

Figure 1A:
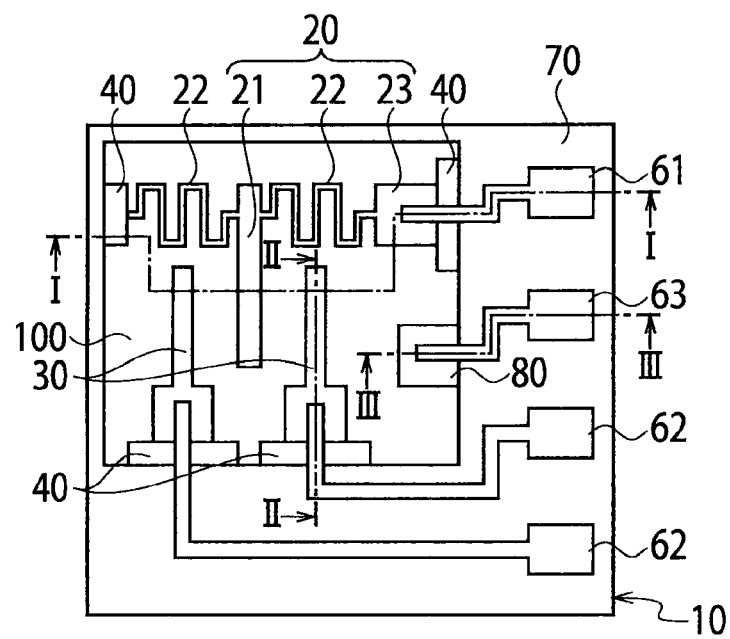
FIG. 1A is a schematic top view showing a structure of a semiconductor device according to an embodiment of the present invention.

Next, with reference to the drawings, an embodiment of the present invention will be described. In the following description of the drawings, same or similar parts are given same of similar symbols or numerals. The drawings are schematic, and the relation between thickness and planar dimensions, the proportion of thicknesses of layers, and the like in the drawings are different from real ones. Accordingly, specific thicknesses and dimensions should be determined referring to the following description. Moreover, it is certain that some portions have different dimensional relations or different proportion among the drawings.

The following embodiment shows examples of apparatuses or methods for embodying the technical idea of the present invention and does not specify the materials, shapes, structures, arrangements, and the like of constituent components to the following ones. The technical idea of the invention can be variously modified within the scope of the claims.

Figure 1B:
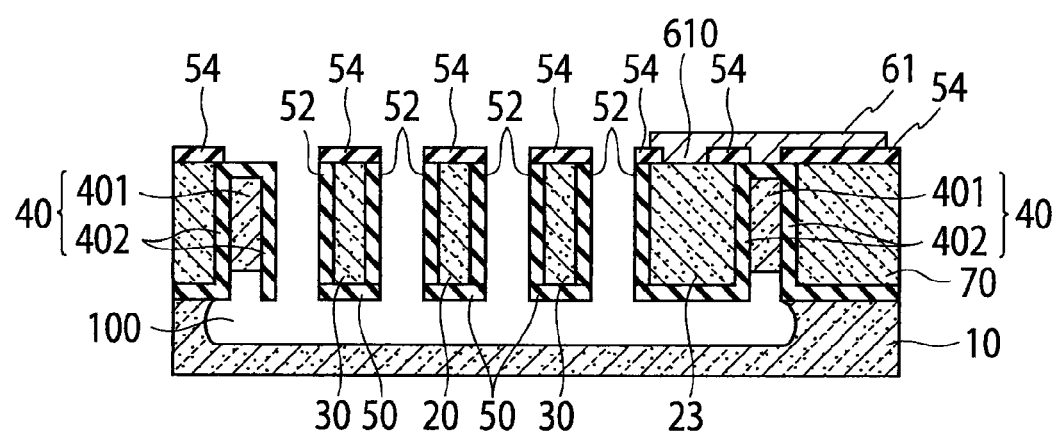
FIG. 1B is a cross-sectional view taken along a line I-I of FIG. 1A.

As shown in FIGS. 1A and 1B, a semiconductor device according to an embodiment of the present invention includes: a semiconductor substrate 10 with a recess portion 100 formed in a top surface; a supporting body 70; a beam-type movable portion 20; beam-type fixed electrodes 30; and isolation regions 40. The supporting body 70 is provided on the semiconductor substrate 10 so as to surround the recess portion 100. The movable portion 20 includes a movable electrode 21 provided above the recess portion 100 and is fixed to the supporting body 70 at the position away from the movable electrode 21. Each of the fixed electrodes 30 is provided above the recess portion 100 so as to be opposed to the movable electrode 21. Each isolation region 40 includes a separation column 401 made of a semiconductor and a separation insulating film 402 provided on the side surface of the separation column 401. The isolation regions 40 are provided so as to electrically separate the movable electrode 21 and fixed electrodes 30 from the supporting body 70.

Figure 2:
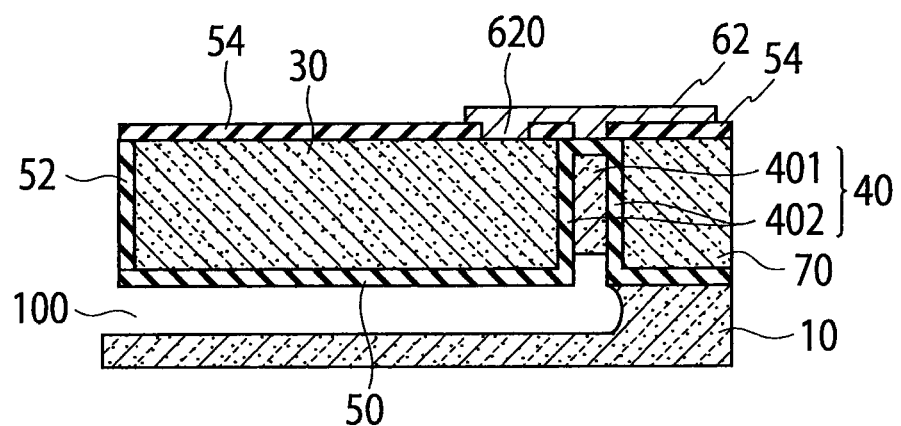
FIG. 2 is a cross-sectional view taken along a line II-II of FIG. 1A.

As shown in FIGS. 1A, 1B, and 2, some of the isolation regions 40 are provided between the movable electrode 21 and the supporting body 70 to electrically separate the movable electrode 21 from the supporting body 70. The other isolation regions 40 are individually provided between the fixed electrodes 30 and the supporting body 70 to electrically separate the fixed electrodes 30 from the supporting body 70. As shown in FIGS. 1B and 2, there is no insulating film provided on the bottom surface of the separation column 401 of each isolation region 40. The bottom surfaces of the separation columns 401 are exposed in the recess portion 100.

As shown in FIG. 1A, the movable portion 20 is a beam-type oscillator including the movable electrode 21, a fixed portion 23, and a spring portion 22. The movable electrode 21 extends to central part of the recess portion 100 above the recess portion 100 and is opposed to the fixed electrodes 30. The fixed portion 23 is fixed to the supporting body 70 with the isolation region 40 interposed therebetween at the position away from the movable electrode 21. The spring portion 22 connects the movable electrode 21 to the fixed portion 23. The movable electrode 21 and fixed portion 23 are connected by the spring portion 22, which has a flexible spring shape, so that the movable electrode 21 easily moves. This increases the detection sensitivity of the semiconductor device. In the embodiment shown in FIG. 1A, the movable portion 20 is connected to the supporting body 70 by the spring portion 22 and another spring portion 22, each of which is square-edged vertical zigzag shaped in relation to the drawing. Accordingly, the movable electrode 21 tends to oscillate in the horizontal direction I relation to the drawing. The semiconductor device shown in FIG. 1A therefore mainly detects external force applied in the horizontal direction in relation go the drawing.

As shown in FIG. 1B, a bottom insulating film 50 is formed on the bottom surface of the movable portion 20. Furthermore, side insulating films 52 and an upper insulating film 54 are provided on the side surfaces and top surface of the movable portion 20, respectively, so that the movable portion 20 is entirely covered with the insulating films.

Each of the fixed electrodes 30 has a beam shape with a fixed end fixed to the supporting body 70 with one of the isolation regions 40 interposed therebetween and with a free end extending above the recess portion 100. As shown in FIG. 2, on the lower, side, and top surfaces of each fixed electrode 30, a lower insulating film 50, a side insulating film 52, and an upper insulating film 54 are provided, respectively, so that the fixed electrode 30 is entirely covered with insulating film.

In the top view of the semiconductor device according to the embodiment of the present invention, the insulating films including the side insulating films 52, separation insulating films 402, and the like provided on the side surfaces are not shown.

As described above, the movable portion 20 and fixed electrodes 30 are fixed to the supporting body 70 with the isolation regions 40 individually interposed therebetween. Accordingly, the movable electrode 21 and fixed electrodes 30 are electrically separated by the isolation regions 40. The movable electrode 21 and fixed electrodes 30 therefore function as a capacitor plate.

The position of the movable portion 20 changes by external force externally applied to the semiconductor device, and the distance between the movable electrode 21 and each fixed electrode 30 is changed. When the semiconductor device is subjected to external force with voltage being applied across the movable electrode 21 and fixed electrodes 30, the change in distance between the movable electrode 21 and each fixed electrode 30 is detected as a change in capacitance. The semiconductor device transmits the detected change in capacitance as a detection signal to a signal processing circuit (not shown). The signal processing circuit processes the detection signal to detect an acceleration generated at the semiconductor device. In other words, the semiconductor device shown in FIG. 1A constitutes a part of an acceleration detector configured to detect an acceleration based on the change in capacitance between the movable electrode 21 and fixed electrodes 30. The signal processing circuit may be provided in a same chip as the semiconductor device or may be provided in a chip different from the semiconductor device.

An electrode wire 61 transmitting a value of voltage of the movable electrode 21 to the signal processing circuit is connected to the movable portion 20 through an opening portion 610 formed by partially removing the upper insulating film 54 of the movable portion 20. In the example shown in FIG. 1B, the electrode wire 61 is connected to the movable portion 20 at the fixed portion 23. On the other hand, as shown in FIG. 2, an electrode wire 62 for transmitting a value of voltage of each fixed electrode 30 is connected to the fixed electrode 30 through an opening portion 620 formed by partially removing the upper insulating film 54 of the fixed electrode 30.

In the semiconductor device shown in FIGS. 1A and 1B, the movable electrode 21 and fixed electrodes 30 are inter-digitated. This increases the total area of the portion of the movable electrode 21 opposed to the fixed electrodes 30, so that the capacitance between the movable electrode 21 and fixed electrodes 30 is increased. It is therefore possible to detect acceleration with high sensitivity. The widths of the movable portion 20 and each fixed electrode 30 in a region where the movable portion 20 is opposed to the fixed electrode 30 are about 3 to 10 μm, for example, and the distance between the movable portion 20 and each fixed electrode 30 is about 1 to 2 μm, for example.

The semiconductor substrate 10 and the supporting body 70 are electrically connected through a contact electrode 80 shown in FIG. 1A. The semiconductor substrate 1 and the supporting body 70 therefore have a same potential. By stabilizing the potentials of the semiconductor substrate 10 and supporting body 70, the semiconductor device configured to detect minute capacitance can perform stable operation. The provision of the contact electrode 80 allows the potential of the semiconductor substrate 10 to be set from the surface of the semiconductor device.

Figure 3:
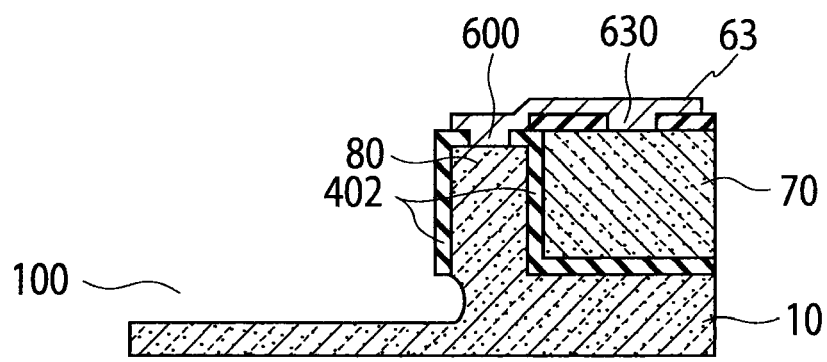
FIG. 3 is a cross-sectional view taken along a line III-III of FIG. 1A.

FIG. 3 shows the structure of the contact electrode 80. On the side surface of the contact electrode 80, a separation insulating film 402 is formed. The bottom of the contact electrode 80 is connected to the semiconductor substrate 10. An electrode wire 63, which electrically connects the contact electrode 80 and supporting body 70 , is connected to the contact electrode 80 at an opening portion 600 of an insulating film on the contact electrode 80 and is connected to the supporting body 70 at an opening portion 630 of an insulating film on the supporting body 70. The contact electrode 80 is connected to the semiconductor substrate 10 at the lower part and is electrically connected to the supporting body 70 at the upper part. The contact electrode 80 is a part of the region which is left unetched at the fabricating step of etching a part of the upper part of the semiconductor substrate 10 to form the separation columns 401.

As described above, in the semiconductor device according to the embodiment of the present invention, the isolation regions 40, each of which includes the separation column 401 made of a semiconductor and the separation insulating film 402 provided on the side surface of the separation column 401, electrically separate the movable electrode 21 and fixed electrodes 30 from the supporting body 70. The width and thickness of the isolation regions 40 are dependent on the widths and thicknesses of the separation columns 401 and separation insulating films 402. Making the separation columns 401 high is easier than forming a deep groove with the width of the groove being maintained equal to a certain value or less.

Accordingly, the area of the portion of the movable electrode 21 opposed to each fixed electrode 30 in the semiconductor device according to the embodiment of the present invention, which includes the isolation regions 40 each composed of the separation column 401 and separation insulating film 402, can be made larger than that of MEMS devices of the related art which include an isolation region formed by filling a groove for isolation with an insulating material. According to the present invention, the limitation on the sensitivity of the MEMS devices due to the isolation regions is prevented, and it is possible to provide a semiconductor device with high detection sensitivity.

Figure 4A:
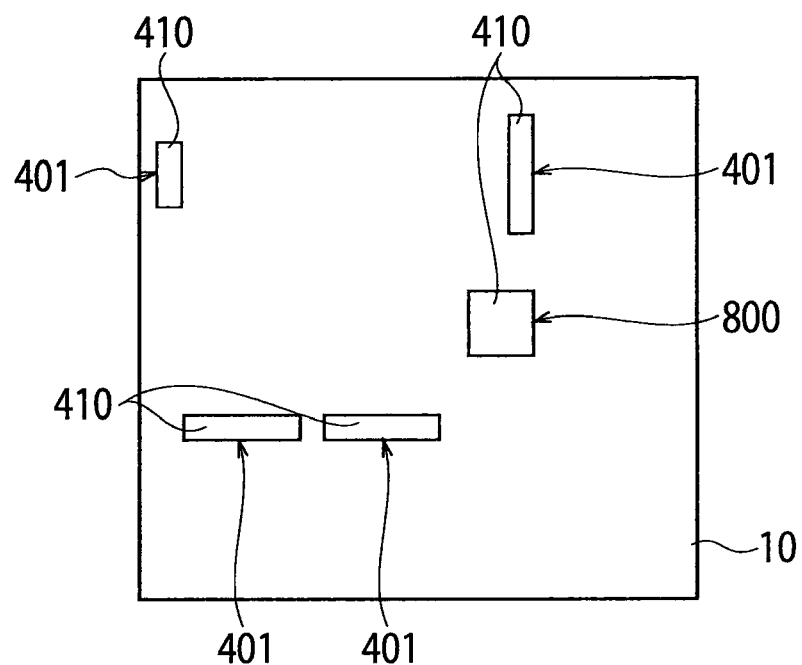
FIG. 4A is a process plan view for explaining a method of fabricating a semiconductor device according to the embodiment of the present invention (No. 1).

Next, a description is given of a method of fabricating a semiconductor device according to the embodiment of the present invention with reference to FIGS. 4A and 4B to FIGS. 11A and 11B. FIGS. 4A, 5A, . . . and 11A are top views, and FIGS. 4B, 5B, . . . and 11B are cross-sectional views at the position corresponding to the line I-I of FIG. 1A. The method of fabricating a semiconductor device described below is just an example and can be implemented by other various fabricating methods including modifications thereof.

Figure 4B:
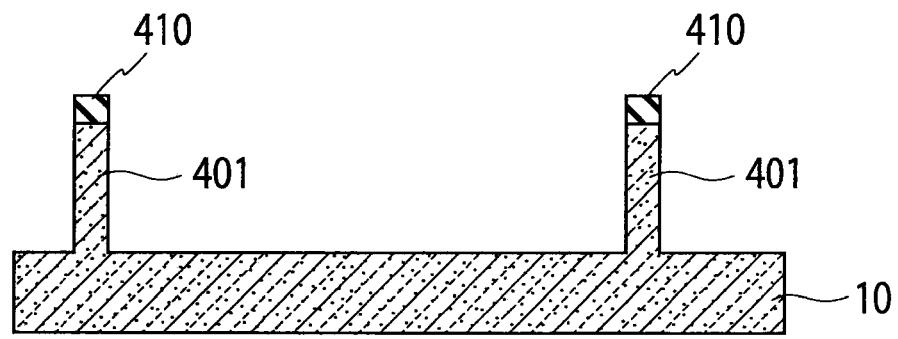
FIG. 4B is a process cross-sectional view for explaining the method of fabricating a semiconductor device according to the embodiment of the present invention (No. 1).

(a) On the semiconductor device 10, insulating films 410 as an etching mask are formed using thermal oxidation, chemical vapor deposition (CVD), or the like. The semiconductor substrate 10 can be a silicon (Si) substrate or the like. The insulating films 410 can be silicon oxide ($SiO_2$) films or the like, for example. The insulating films 410 are patterned using photolithography, etching, or the like to partially remain where the separation columns 401 and contact electrode 80 are to be formed. Next, upper part of the semiconductor substrate 10 is partially etched using the insulating films 410 as a mask, thus forming the plurality of separation columns 401 made of a semiconductor as shown in FIGS. 4A and 4B. The contact electrode 80 is formed at the same time as the separation columns 401. The separation columns 401 and contact electrode 80 have heights of about 30 to 100 and widths of several micrometers, for example. The etching of the semiconductor substrate 10 can be the Bosch process using D-RIE, wet etching using hydrofluoric acid, or the like.

Figure 5A:
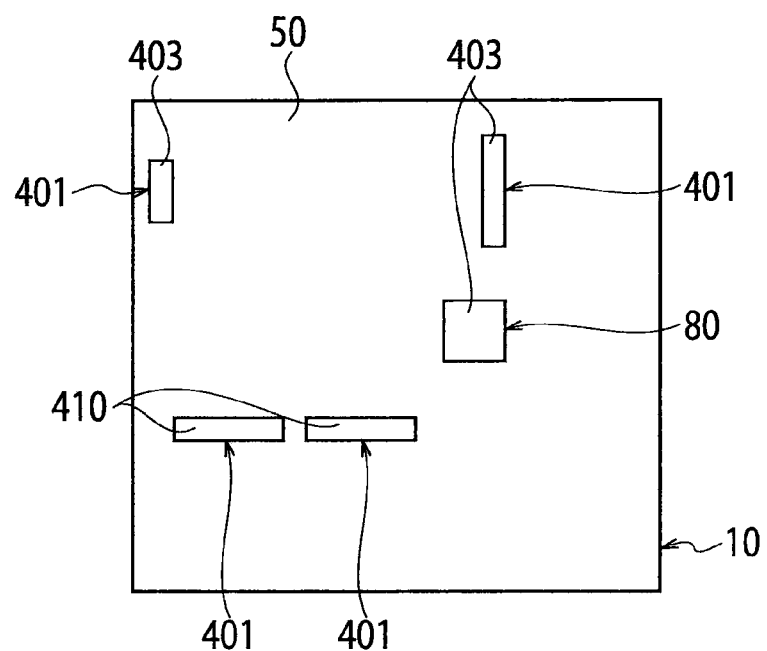
FIG. 5A is a process plan view for explaining the method of fabricating a semiconductor device according to the embodiment of the present invention (No. 2).
Figure 5B:
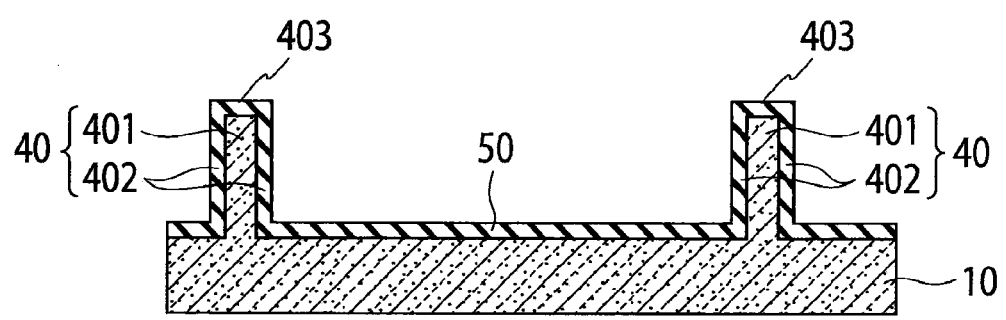
FIG. 5B is a process cross-sectional view for explaining the method of fabricating a semiconductor device according to the embodiment of the present invention (No. 2).

(b) After the insulating films 410 are removed, an insulating film is formed on the surface of the semiconductor substrate 10 using thermal oxidation, CVD, or the like as shown in FIGS. 5A and 5B. Specifically, on the upper surface of the semiconductor substrate 10, the lower insulating film 50 is provided to form the separation insulating films 402 on the side surfaces of the separation columns 401. At this time, the insulating film 403 is formed on the top surface of each separation column 401. The separation insulating film 402, which is not shown in the drawing, is also formed on the side surface of the contact electrode 80. The film thicknesses of the separation insulating films 402 are about 0.1 to 0.3 μm.

Figure 6A:
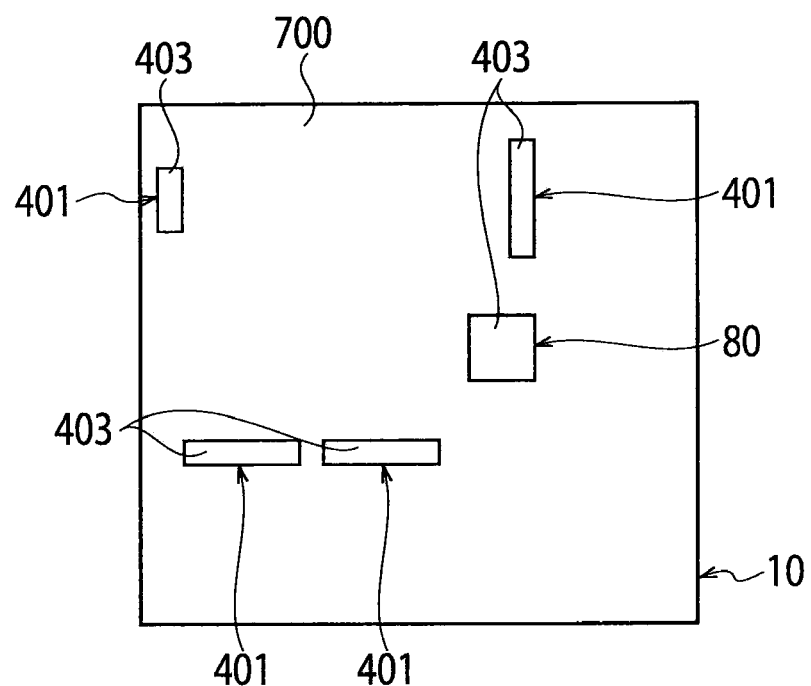
FIG. 6A is a process plan view for explaining the method of fabricating a semiconductor device according to the embodiment of the present invention (No. 3).
Figure 6B:
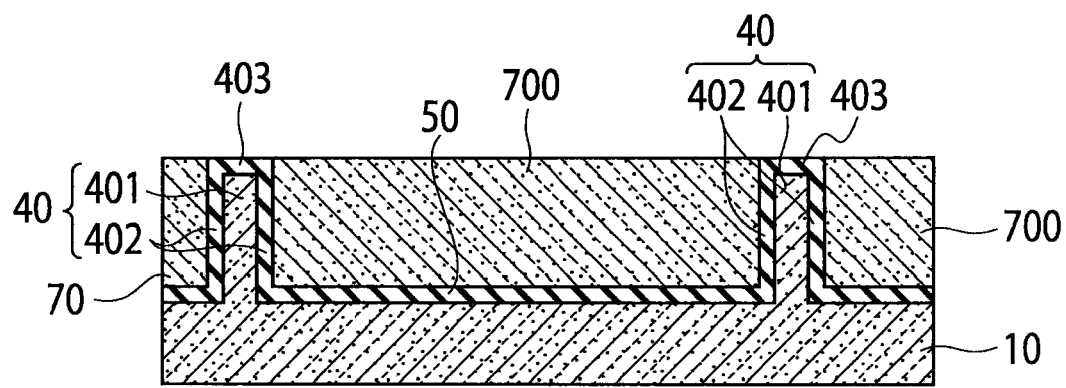
FIG. 6B is a process cross-sectional view for explaining the method of fabricating a semiconductor device according to the embodiment of the present invention (No. 3).

(c) As shown in FIGS. 6A and 6B, a burying semiconductor film 700 is formed on the lower insulating film 50 to bury the isolation regions 40, each of which is composed of the separation column 401 and separation insulating film 402, and the contact electrode 80. For example, the burying semiconductor film 700 is formed by deposition of polysilicon film on the semiconductor substrate 10 by epitaxial growth or the like. Thereafter, upper part of the burying semiconductor film 700 is etched by chemical mechanical polishing (CMP) or the like until the surfaces of the insulating films 403 on the separation columns 401 are exposed. As described later, the burying semiconductor film 700 is processed to form the movable portions 20 and fixed electrodes 30.

Figure 7A:
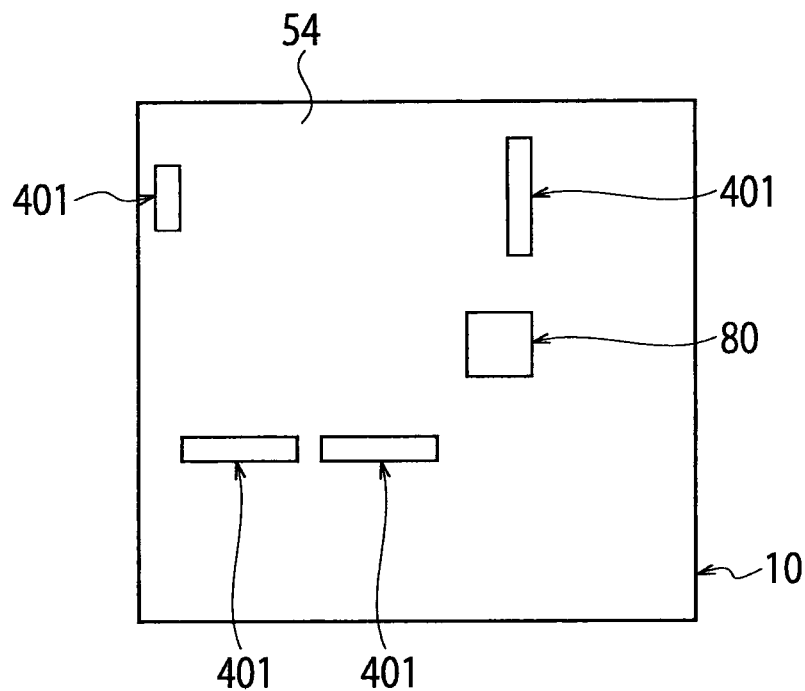
FIG. 7A is a process plan view for explaining the method of fabricating a semiconductor device according to the embodiment of the present invention (No. 4).
Figure 7B:
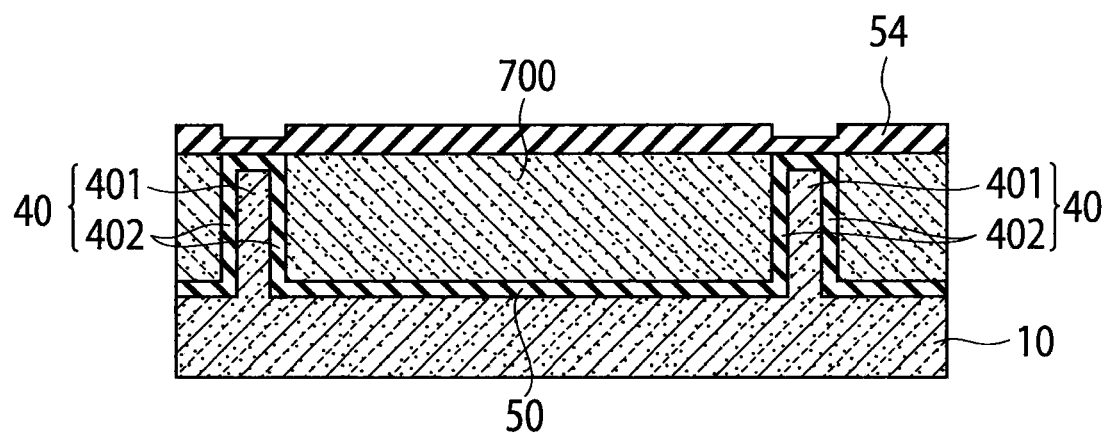
FIG. 7B is a process cross-sectional view for explaining the method of fabricating a semiconductor device according to the embodiment of the present invention (No. 4).

(d) As shown in FIGS. 7A and 7B, on the burying semiconductor film 700, the upper insulating film 54 with a thickness of 0.5 to 4.0 μm, for example, is formed. The upper insulating film 54 can be a $SiO_2$ film, a silicon nitride (SiN) film, or a laminate of $SiO_2$ and SiN films.

Figure 8A:
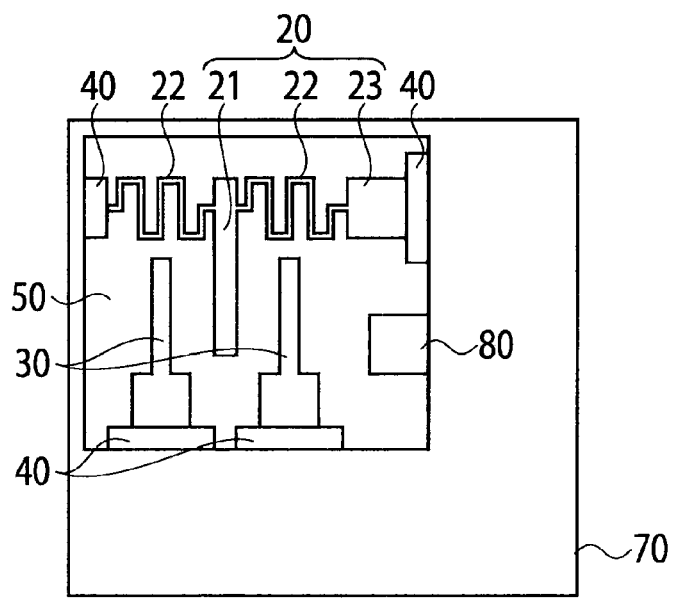
FIG. 8A is a process plan view for explaining the method of fabricating a semiconductor device according to the embodiment of the present invention (No. 5).
Figure 8B:
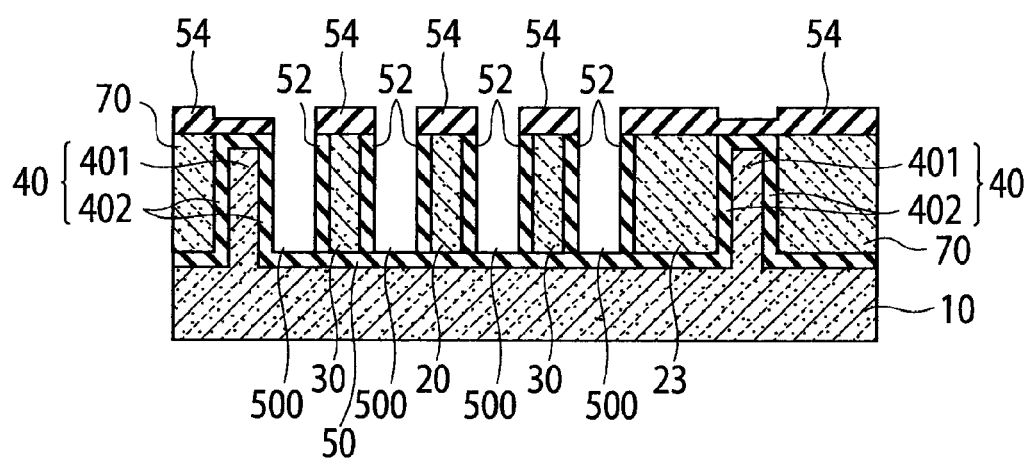
FIG. 8B is a process cross-sectional view for explaining the method of fabricating a semiconductor device according to the embodiment of the present invention (No. 5).

(e) The burying semiconductor film 700 is selectively etched to form side grooves 500 where the side surfaces of the movable portion 20 and fixed electrodes 30 are exposed. As shown in FIGS. 8A and 8B, the side insulting films 52 are formed on the surfaces of the side grooves 500, or the side surfaces of the movable portion 20 and fixed electrodes 30. Each of the side insulating films 52 can be an insulating film, such as a $SiO_2$ film or SiN film, which has a thickness of about 0.1 to 1.0 μm, for example. The side insulating films 52 can be formed by thermal oxidation, CVD, or the like. The burying semiconductor film 700 is selectively etched as follows, for example. In short, the upper insulating film 54 is formed into a desired pattern using photolithography or selective etching. To be specific, a portion of the upper insulating film 54 where the recess portion 100 is to be formed is removed so that the upper insulating film 54 remains on regions where the movable portion 20, fixed electrodes 30, isolation regions 40, supporting body 70, and contact electrode 80 are to be formed. Using the upper insulating film 54 as an etching mask, a part of the burying semiconductor film 700 is selectively etched and removed. The movable portion 20 and fixed electrodes 30, which are composed of parts of the burying semiconductor film 700, are therefore individually connected to the supporting body 70, which is composed of a part of the burying semiconductor film 700 on the peripheral region of the semiconductor substrate 10, through the isolation regions 40.

Figure 9A:
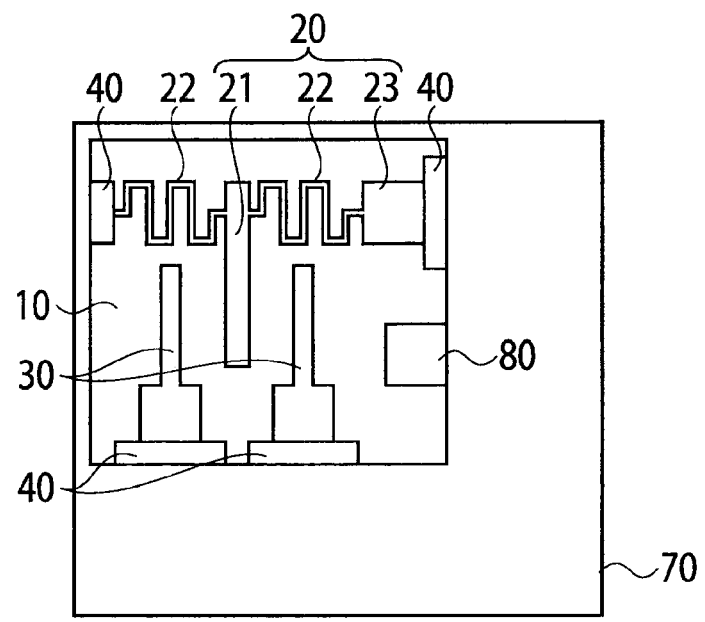
FIG. 9A is a process plan view for explaining the method of fabricating a semiconductor device according to the embodiment of the present invention (No. 6).
Figure 9B:
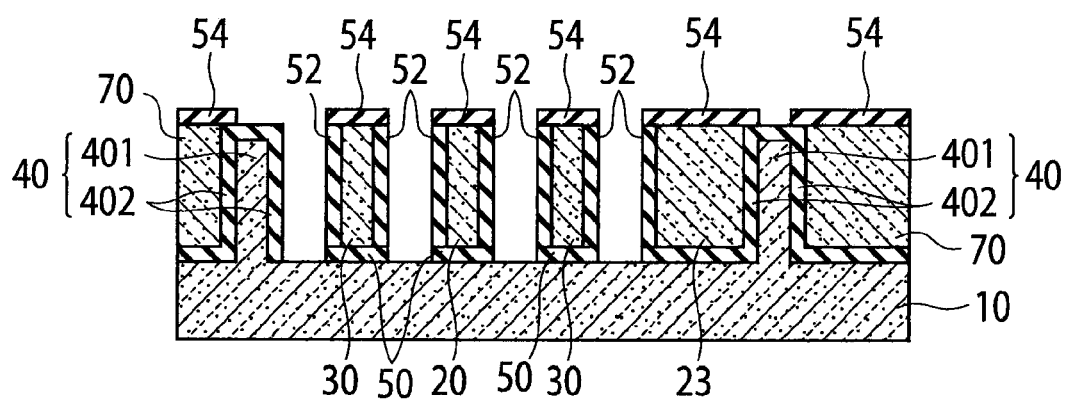
FIG. 9B is a process cross-sectional view for explaining the method of fabricating a semiconductor device according to the embodiment of the present invention (No. 6).

(f) As shown in FIGS. 9A and 9B, the portion of the lower insulating film 50 exposed at the bottom of each side groove 500 is removed by anisotropic etching. The surface of the semiconductor substrate 10 is exposed at the bottom of each side groove 500. On the other hand, the lower insulating film 50 remains on the bottom surfaces of the movable portion 20 and fixed electrodes 30. When the lower insulating film 50 is etched, upper part of the upper insulating film 54 is simultaneously etched and removed. It is therefore necessary that the thickness of the upper insulating film 54 is made thicker than that of the lower insulating film 50.

Figure 10A:
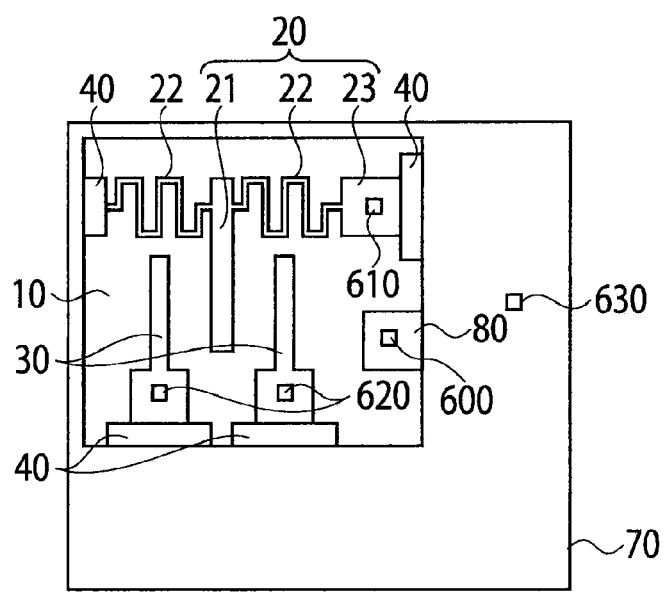
FIG. 10A is a process plan view for explaining the method of fabricating a semiconductor device according to the embodiment of the present invention (No. 7).
Figure 10B:
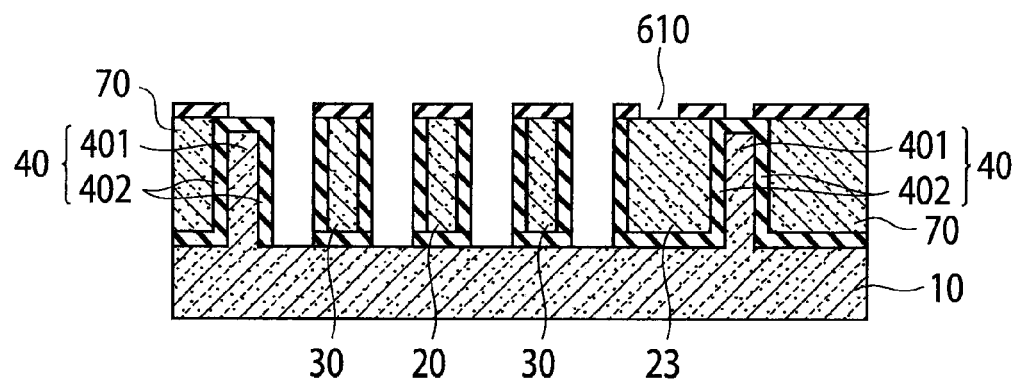
FIG. 10B is a process cross-sectional view for explaining the method of fabricating a semiconductor device according to the embodiment of the present invention (No. 7).

(g) As shown in FIG. 10B, the opening portion 610 is formed using photolithography or the like. At the same time, the opening portions 600, 620, and 630 are simultaneously formed as shown in FIG. 10A. For example, after a photoresist film is formed on the insulating film formed on the top surfaces of the movable portion 20, fixed electrodes 30, supporting body 70, and contact electrode 80, the portion of the photoresist film where the opening portions 610, 620, 630, and 600 are to be formed are removed. The insulating film is etched and removed using the photoresist film as a mask for forming the opening portions 610, 620, 630, and 600.

Figure 11A:
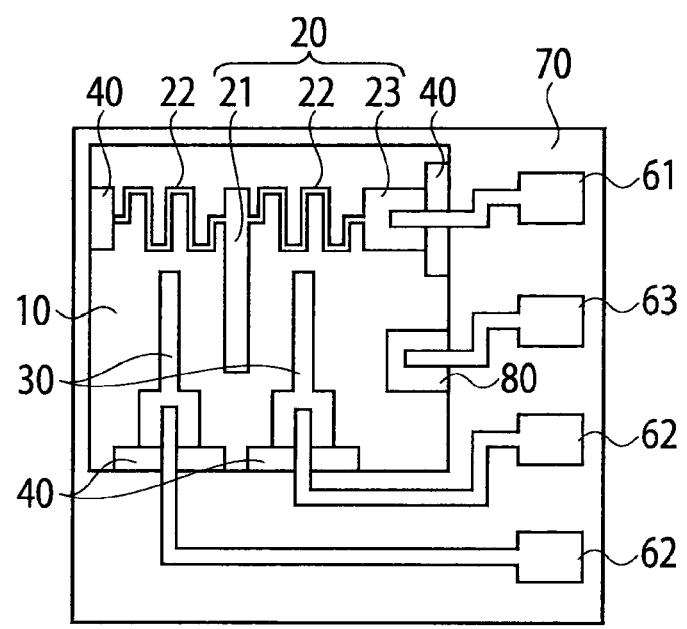
FIG. 11A is a process plan view for explaining the method of fabricating a semiconductor device according to the embodiment of the present invention (No. 8).
Figure 11B:
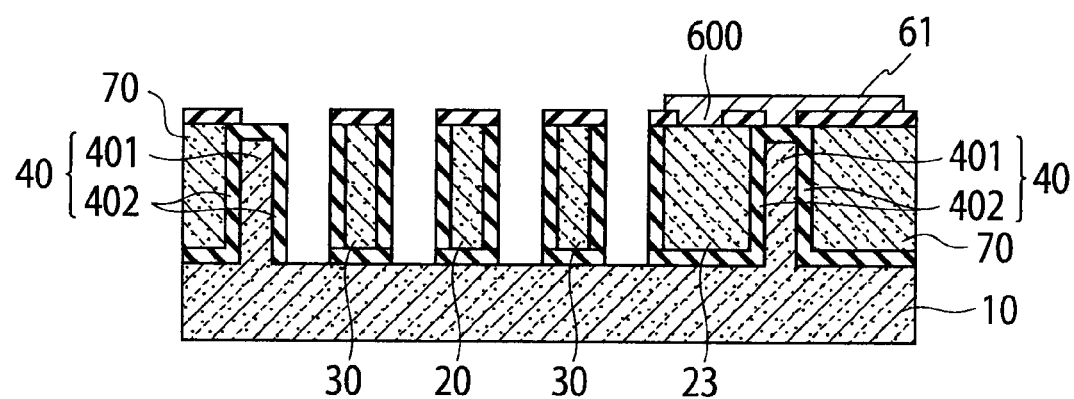
FIG. 11B is a process cross-sectional view for explaining the method of fabricating a semiconductor device according to the embodiment of the present invention (No. 8).

(h) Subsequently, as shown in FIGS. 11A and 11B, the electrode wire 61, which is connected to the movable portion 20 through the opening portion 610, is formed. At the same time, the electrode wires 62, which are connected to the fixed electrodes 30 through the opening portions 620, and the electrode wire 63, which is connected to the supporting body 70 through the opening portion 630 and is connected to the contact electrode 80 through the opening portion

Figure 12:
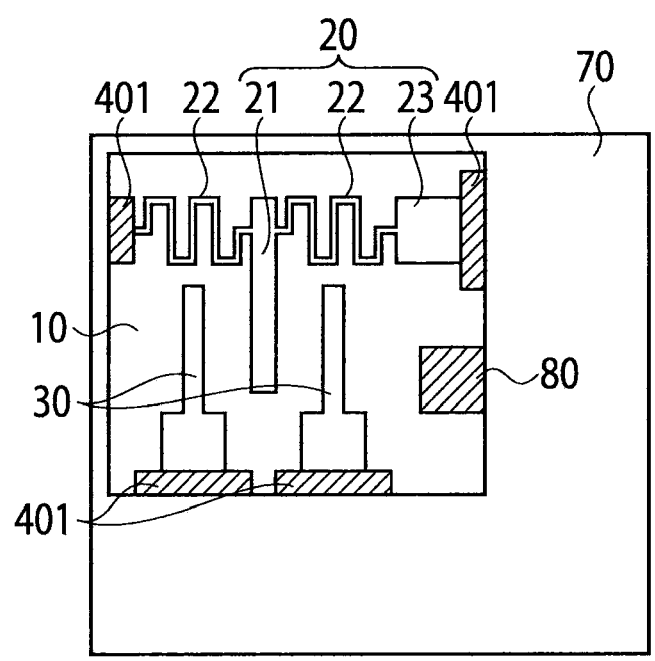
FIG. 12 is a top view of the semiconductor device shown in FIGS. 11A and 11B, which is seen through an insulating film.

600, are formed. For example, the electrode wires 61 to 63 made of metallic film such as aluminum (Al) film are formed by a lift-off process using a photoresist film of a desired pattern or by etching using the photoresist film as an etching mask, for example. FIG. 12 is a top view showing a semiconductor device shown in FIG. 11A with the electrode wires 61 to 63 and upper insulating films 54 being removed. In FIG. 12, the hatched areas indicate the portions formed by partially etching the upper part of the semiconductor substrate 10.

(i) The recess portion 100 is formed by partially isotropically etching the upper part of the semiconductor substrate 10 using the side and lower insulating films 52 and 50 as a mask. The isotropic etching (hereinafter, referred to as release etching) separates the movable portion 20 and fixed electrodes 30 from the semiconductor substrate 10 and exposes the portion of the lower insulating film 50 provided on the bottom surfaces of the movable portion 20 and fixed portions 30. In short, by the release etching for forming the recess portion 100 in the upper surface of the semiconductor substrate 10, the movable portion 20 and fixed electrodes 30 are provided above the recess portion 100. If the semiconductor substrate 10 is a silicon substrate, for example, the release etching can use an isotropic etcher including sulfur hexafluoride ($SF_6$) or xenon difluoride ($XeF_2$). The semiconductor device shown in FIGS. 1A and 1B is thus completed.

As described above, the separation column 401 of each isolation region 40 is a portion of the upper part of the semiconductor substrate 10 which is left unetched. Accordingly, the semiconductor substrate 10 and the separation columns 401 have a same crystal orientation. Similarly, the contact electrode 80 and the semiconductor substrate 10 also have a same crystal orientation.

Moreover, by the lower insulating film 50 provided on the bottom surfaces of the movable portion 20 and fixed electrodes 30, the bottom surfaces thereof are prevented from being etched by the release etching. This prevents the movable portion 20 and fixed electrodes 30 from being thin, thus preventing the area of the movable portion 20 opposed to each fixed electrode 30 from being reduced. Accordingly, the semiconductor device according to the embodiment of the present invention has higher detection sensitivity than that of the detector in which the lower insulating film 50 is not provided on the bottom surfaces of the movable portion 20 and fixed electrodes 30.

The above description shows the example where the semiconductor substrate 10 is composed of a Si substrate.

However, the material of the semiconductor substrate 10 is not limited to Si and can be selected from all kinds of semiconductor materials including compounds such as silicon carbide (SiC), silicon germanium (SiGe), and gallium nitride (GaN). In the above example, the burying semiconductor film 700 is polysilicon film. However, the burying semiconductor film 700 may be made of semiconductor film other than polysilicon film and can be single crystal silicon film, for example.

Figure 13:
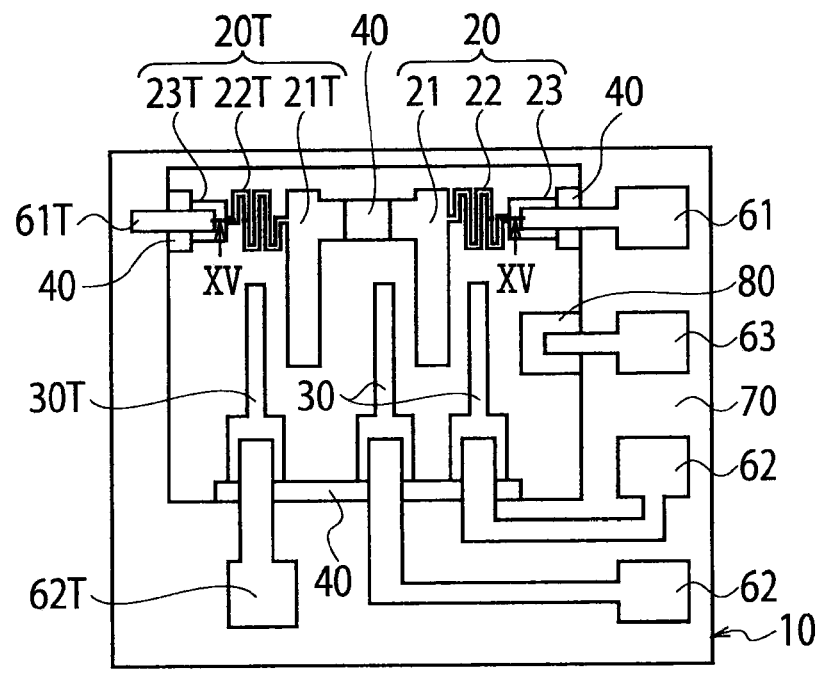
FIG. 13 is a schematic top view showing a structure of the semiconductor device according to the embodiment of the present invention provided with a test electrode.

As shown in FIG. 13, the semiconductor device according to the embodiment of the present invention may further include a test movable portion 20T and a test fixed electrode 30T. The test movable portion 20T is a beam-type oscillator including: a movable electrode 21T; a fixed portion 23T fixed to the supporting body 70 with the isolation region 40 interposed therebetween; and a spring portion 22T connecting the movable electrode 21T and fixed portion 23T. The test fixed electrode 30T is arranged opposed to the movable electrode 21T and fixed to the supporting body 70 with the isolation region 40 interposed therebetween.

By applying voltage across the test movable portion 20T and test fixed electrode 30T through the electrode wires 61T and 62T, electrostatic force is generated. If the moving part is normally formed, the generated electrostatic force makes a change in position of the moving part, thus resulting in a change in capacitance between the test movable portion 20T and test fixed electrode 30T. This can provide nondestructive inspection of the semiconductor device.

Figure 14:
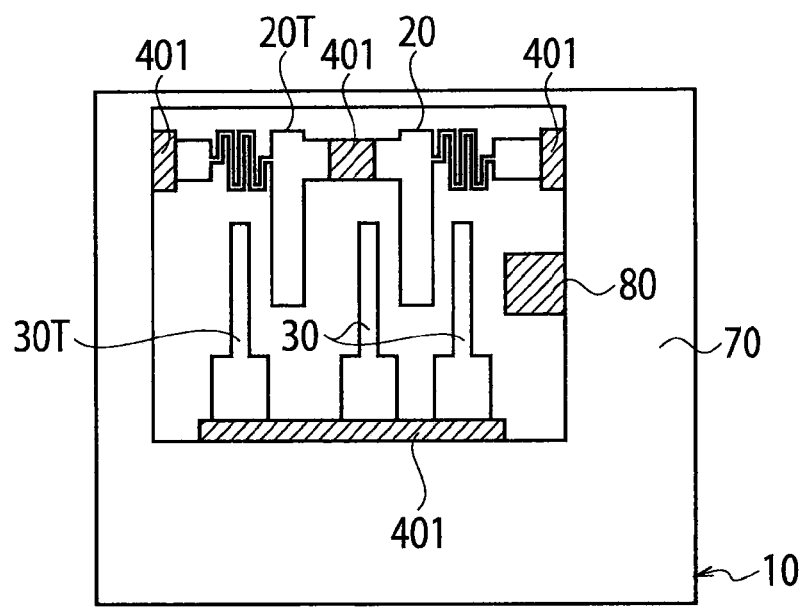
FIG. 14 is a top view of the semiconductor device shown in FIG. 13 with the insulating film removed.

In the semiconductor device shown in FIG. 13, the isolation region 40 is formed between the test movable portion 20T and test movable portion 20 so that the movable portion 20 for acceleration detection is not affected by parasitic capacitance of the test movable portion 20T. FIG. 14 is a top view showing the semiconductor device shown in FIG. 13 with the electrode wires and insulating film removed. The regions indicated by hatching in FIG. 14 are formed by etching the upper part of the semiconductor substrate 10. On the other hand, the movable portion 20, fixed electrodes 30, test movable portion 20T, test fixed electrode 30T, and supporting body 70 are formed by partially etching the burying semiconductor film 700.

The bottoms of the isolation regions 40 are separated from the semiconductor device 10 by the release etching because the positions of the movable portions 20 and test movable portion 20T need to move. With reference to FIGS. 15A to 15D, a description is given of the changing shape of one of the isolation regions 40 of the semiconductor device shown in FIG. 13 during the release etching. FIGS. 15A to 15D are cross-sectional views taken along a line XV-XV of FIG. 13, where the spring portions 22 and 22T are not shown.

Figure 15A:
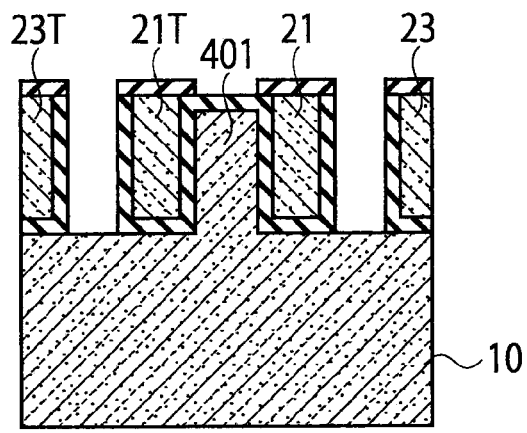
FIG. 15A is a process cross-sectional view showing a method of separating a separation column of the semiconductor device shown in FIG. 13 from a semiconductor substrate (No. 1).
Figure 15B:
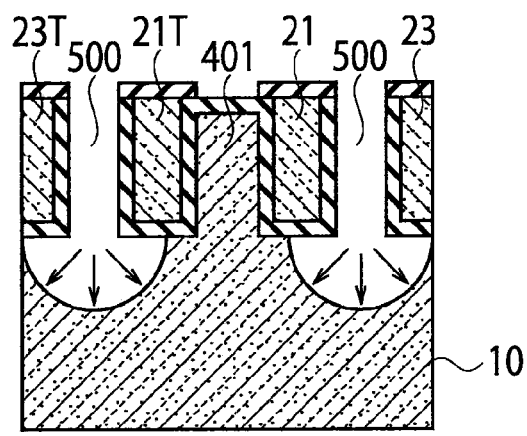
FIG. 15B is a process cross-sectional view showing the method of separating the separation column of the semiconductor device shown in FIG. 13 from the semiconductor substrate (No. 2).

FIG. 15A is a cross-sectional view of the structure of the semiconductor device just before the release etching. FIG. 15B is a cross-sectional view of the structure just after starting the release etching. In FIG. 15B, arrows indicate the progress direction of the release etching (the same goes for FIGS. 15C and 15D). The etchant enters from the side grooves 500, and the etched regions of the semiconductor substrate 10 concentrically expand from the bottoms of the side grooves.

Figure 15C:
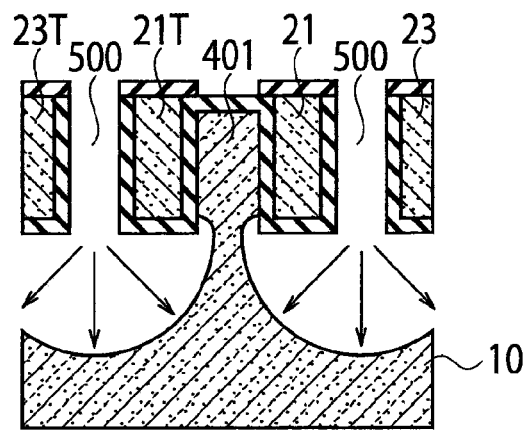
FIG. 15C is a process cross-sectional view showing the method of separating the separation column of the semiconductor device shown in FIG. 13 from the semiconductor substrate (No. 3).
Figure 15D:
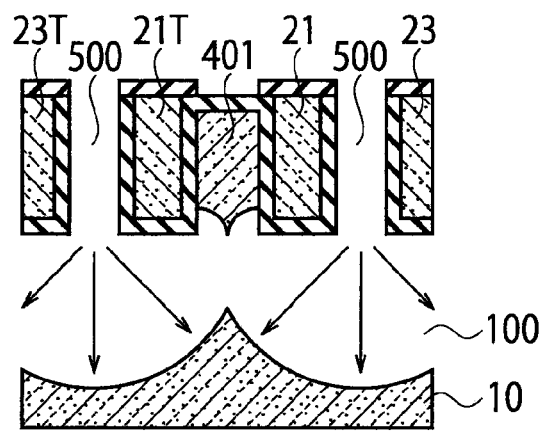
FIG. 15D is a process cross-sectional view showing the method of separating the separation column of the semiconductor device shown in FIG. 13 from the semiconductor substrate (No. 4).

As the release etching progresses, as shown in FIG. 15C, the lower part of each separation column 401 starts to be etched from the periphery thereof. When the release etching further progresses, the lower part of the separation column 401 is separated from the semiconductor substrate 10 as shown in FIG. 15D.

As described above, in the semiconductor device shown in FIG. 13, the lower part of the separation column 401 is etched off from the periphery thereof by the release etching. Accordingly, as shown in FIG. 15D, the bottom surface of the separation column 401 is exposed in the recess portion 100, and the central part of the bottom surface thereof protrudes toward the semiconductor substrate 10. Moreover, the surface of the semiconductor substrate 10 opposed to the protrusion in the bottom surface of the separation column 401 protrudes toward the separation column 401. The shapes of the protrusions formed in the bottom surfaces of the separation columns 401 and in the surface of the semiconductor substrate 100 change depending on the etching rate of the release etching.

Figure 16:
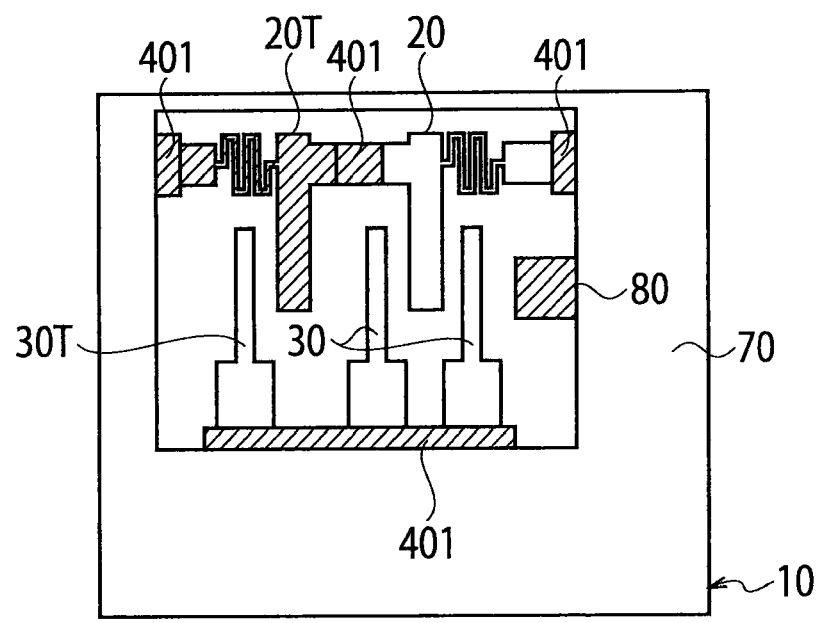
FIG. 16 is another schematic top view of the semiconductor device according to the embodiment of the present invention provided with the test electrode.

FIG. 13 shows an example where the isolation region 40 is formed between the test movable portion 20T and the movable portion 20. The test movable portion 20T may be formed by etching the semiconductor substrate 10, for example. The test movable portion 20T is electrically separated from the movable portion 20 also in this case. FIG. 16 shows an example where the test movable portion 20T is formed by etching the semiconductor substrate 10. FIG. 16 is a top view showing the semiconductor device with the electrode wires and insulating film removed. The hatched regions in FIG. 16 are formed by partially etching upper part of the semiconductor substrate 10.

In the semiconductor device shown in FIG. 16, the spring portion 22T is formed by partially etching upper part of the semiconductor substrate 10. On the other hand, the spring portion 22 is formed by partially etching the burying semiconductor film 700. Accordingly, the spring portion 22T is made of single-crystal silicon film while the spring portion 22 is made of polysilicon film, for example. The single crystal silicon film and polysilicon film are different inflexibility due to external force. For example, the single-crystal silicon is flexible in a particular direction, but the polysilicon film is amorphous and flexible in the same manner in every direction. Accordingly the semiconductor device shown in FIG. 16 is not suitable for multiaxial acceleration sensors and the like.

On the other hand, in the semiconductor device shown in FIG. 13, the spring portions 22 and 22T are made of a same material (polysilicon film, for example), and the isolation region 40 is provided at the center of the moving part. Accordingly, the spring portions 22 and 22T have same flexibility in every direction. This provides high accuracy in detection.

Figure 17:
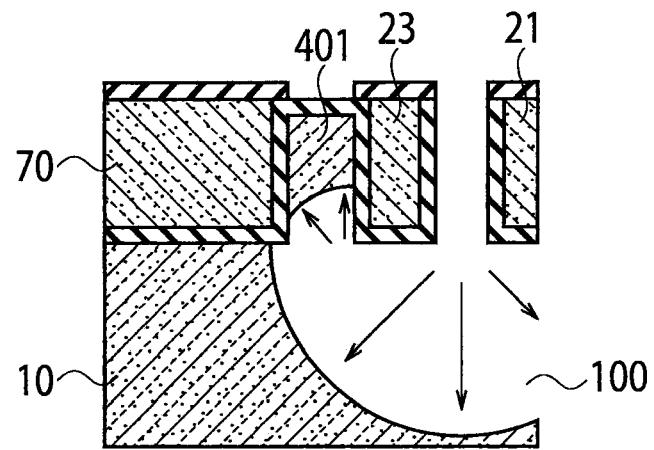
FIG. 17 is a schematic cross-sectional view showing a shape of the separation column of the semiconductor device according to the embodiment of the present invention.

When the isolation region 40 is provided near the outer periphery of the recess portion 100, as shown in FIG. 17, the bottom surface of the separation column 401 is cut by the release etching to have a curve concaved downward. This shape is dependent on the etching speed of the release etching. In the semiconductor device shown in FIG. 1, the bottom surface of the separation column 401 has a curve shape similar to the case of FIG. 17.

Figure 18:
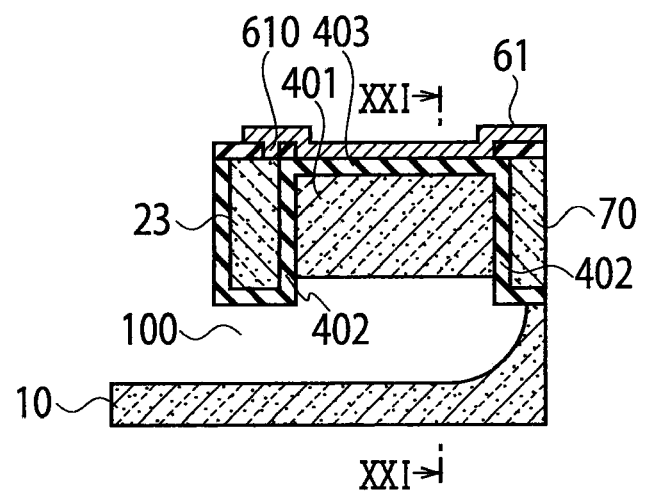
FIG. 18 is a schematic cross-sectional view showing a structure of an isolation region of the semiconductor device according to the embodiment of the present invention.

In the method of fabricating a semiconductor device described with reference to FIGS. 4A and 4B to 11A and 11B, the electrode wire 61 connected to the movable electrode 21 with the fixed portion 23 interposed therebetween is arranged on the insulating film 403 provided on the separation column 401 as shown in FIG. 18. The separation column 401 is therefore electrically separated from the movable electrode 21, and the potential of the separation column 401 can be made different from the potential of the movable electrode 21.

Figure 19:
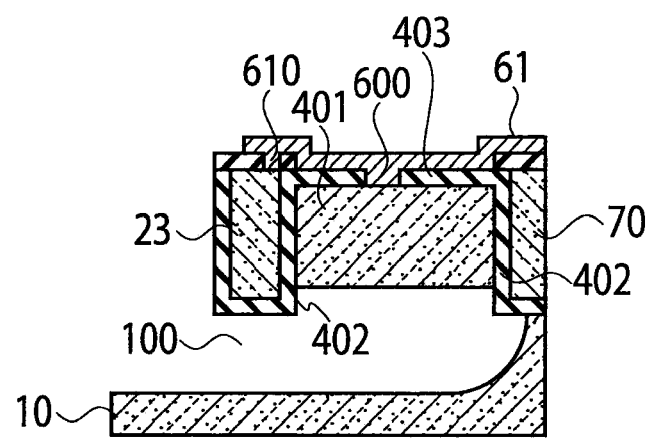
FIG. 19 is a schematic cross-sectional view showing another structure of the isolation region of the semiconductor device according to the embodiment of the present invention.

On the other hand, if necessary, the electrode wire 61 may be brought into contact with the separation column 401 through the opening portion 600 formed in the insulating film 403 on the separation column 401 as shown in FIG. 19. The separation column 401 and movable electrode 21 therefore have a same potential.

As described above, the separation column 401 can be optionally configured so as to have a same potential as that of the movable electrode 21 or to be electrically separated from the movable electrode 21. Moreover, the separation column 401 electrically separated from the movable electrode 21 can be set to an arbitrary potential. Accordingly, it is possible to adjust the potential relation between the separation column 401 and movable electrode 21 if necessary so that the detection accuracy is not affected by stray capacitance generated in the semiconductor device and the like.

Figure 20:
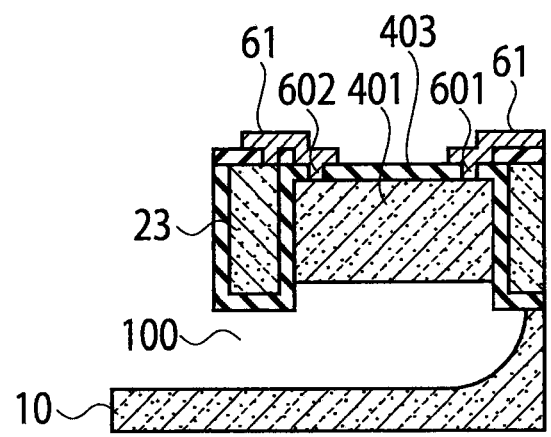
FIG. 20 is a schematic cross-sectional view showing still another structure of the isolation region of the semiconductor device according to the embodiment of the present invention.

If the electrode wire 61 is provided on the entire top surface of the isolation region 40, the isolation region 40 could warp due to the difference in the linear expansion coefficient. In order to prevent such warpage, for example, two opening portions 601 and 602 may be formed on the insulating film 403 on the separation column 401 so that the voltage value of the movable electrode 21 is transmitted through the separation column 401. With the structure where the electrode wire 61 on the separation column 401 is divided as shown in FIG. 20, the warpage of the isolation region 40 due to the difference in the linear expansion coefficient can be prevented. The movable electrode 21 and separation column 401 have a same potential at this time.

Since the movable portion 20 and fixed electrodes 30 are beam-shaped, the etchant goes sideways under the movable portion 20 and fixed electrodes 30 (in the cross direction) to separate the movable portion 20, fixed electrodes 30, and separation column 401 from the semiconductor substrate 10. Accordingly, the recess portion 100 does not need to be deep.

Figure 21:
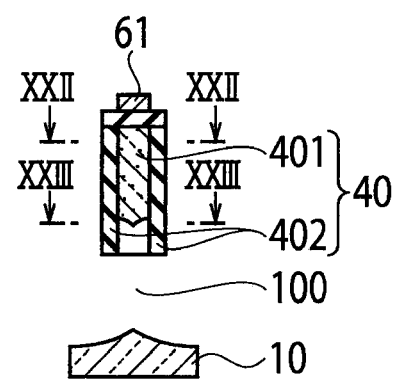
FIG. 21 is a cross sectional view taken along a line XXI-XXI of FIG. 18.

FIG. 21 shows a cross-sectional structure of FIG. 18 taken along the cross direction of the separation column 40. As described above, the center of the bottom surface of the separation column 401 protrudes toward the recess portion 100, and part of the surface of the semiconductor substrate 10 opposed to the protrusion of the separation column 401 protrudes.

Figure 22:
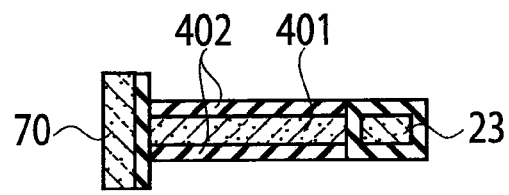
FIG. 22 is a cross sectional view taken along a line XXII-XXII of FIG. 21.
Figure 23:
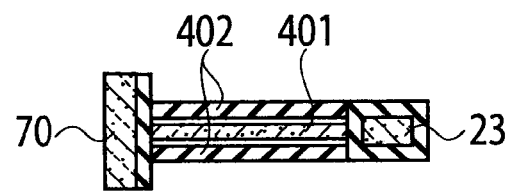
FIG. 23 is a cross sectional view taken along a line XXIII-XXIII of FIG. 21.

As shown in FIG. 22, the separation column 401 is in contact with the separation insulating films 402 provided on both sides at middle part of the separation column 401. However, since the central part of the bottom surface of the separation column 401 protrudes toward the recess portion 100, the separation column 401 is not in contact with the separation insulating films 402 at the bottom end of the separation column 401 as shown in FIG. 23.

Figure 24:
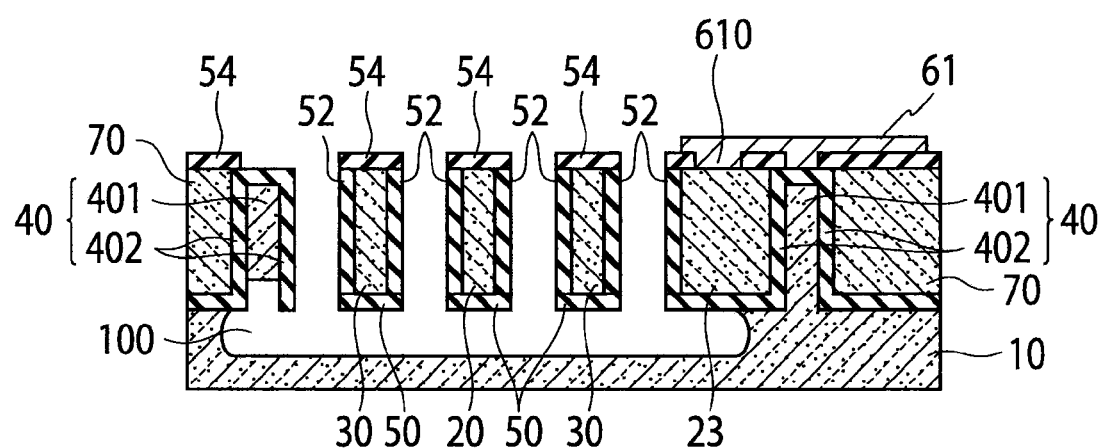
FIG. 24 is a schematic cross-sectional view showing a structure of a semiconductor device according to a modification of the embodiment of the present invention.

FIG. 24 shows a semiconductor device according to a modification of the embodiment of the present invention. In the semiconductor device shown in FIG. 1B, the bottom surface of each separation column 401 is exposed in the recess portion 100 by the release etching for forming the recess portion 100. The semiconductor device shown in FIG. 24 differs from that shown in FIG. 1B in that the separation column 401 of the isolation region 40 electrically separating the movable electrode 21 from the supporting body 70 is connected to the semiconductor substrate 10. The other configuration is the same as that of the embodiment shown in FIG. 1.

The semiconductor device shown in FIG. 24 can be implemented by terminating the release etching for forming the recess portion 100 before the bottom of the separation column 401 of the isolation region 40 is disconnected from the semiconductor substrate 10. The recess portion 100 can be formed with the bottom of the separation column 401 and the semiconductor substrate 10 being connected by increasing the width of the separation column 401 to about several tens micrometers or the like.

Figure 25:
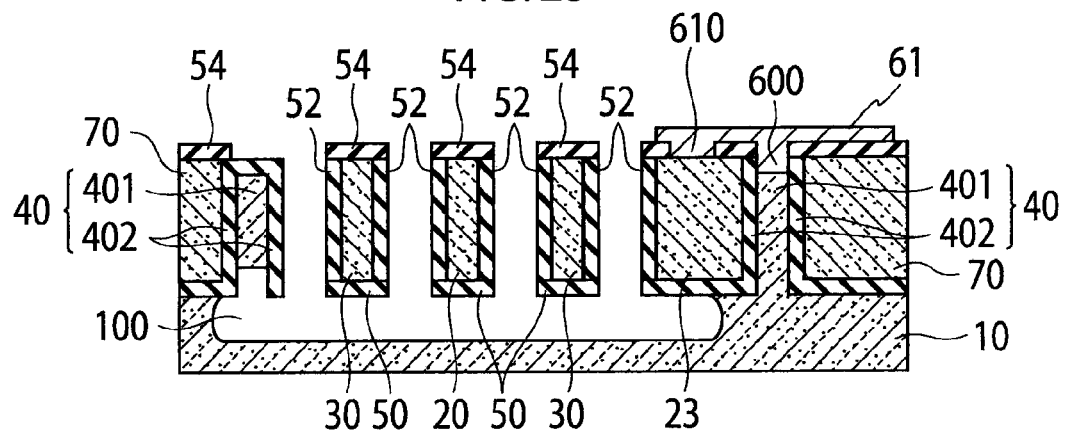
FIG. 25 is a schematic cross-sectional view showing a structure of a semiconductor device according to another modification of the embodiment of the present invention.

As shown in FIG. 25, the electrode wire 61 may be connected to the separation column 401 through the opening portion 600 formed by removing the insulating film formed on the separation column 401. The semiconductor substrate 10 and movable electrode 21 therefore have a same potential, and the potential of the movable electrode 21 is fixed. This can increase the accuracy of the semiconductor device.

As described above, it is difficult to form a deep groove with the width maintained equal to or less than a certain value and uniformly fill the groove with an insulating material. For example, when the groove is narrow, the method of filling the groove by deposition tends to form space not including the insulating material (void) within the groove. The thermal oxidation also tends to form void within the groove because the oxidation speed is generally higher at the opening of the groove than at the bottom thereof. Furthermore, if the width of the groove is increased in order to increase the depth of the groove, it is difficult to fill the groove by the thermal oxidation. Accordingly, in the method of filling a groove for isolation with the insulating material to form the isolation region in the related art, the thickness of the moving part is limited by the depth of the groove. The sensitivity of the MEMS device is therefore limited.

On the other hand, according to the fabricating method described with reference to FIGS. 4A and 4B to FIGS. 11A and 11B, the isolation region 40, which electrically separates the movable portion 20 and fixed electrodes 30 from the supporting body 70, is provided by forming the separation insulating film 402 on the side surface of the each separation column 401 made of the remaining portion of the semiconductor substrate 10.

At forming the separation column 401, the separation column 401 can be made high without any process limitation unlike the step of forming the grooves and the step of filling the grooves with the insulating material. Accordingly, the movable portion 20 and fixed electrodes 30 can be made thick, leading to an increase in detection sensitivity.

Figure 26:
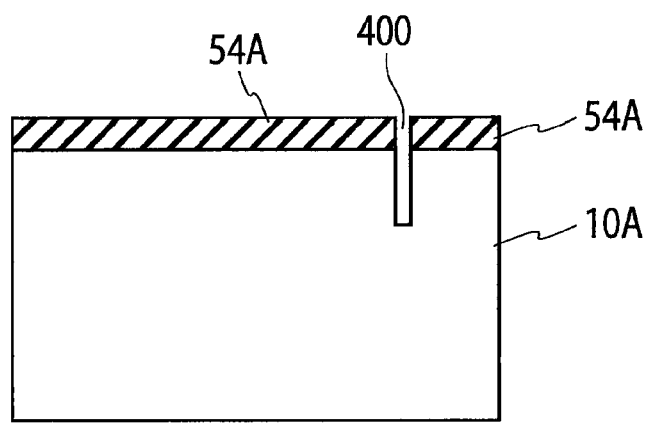
FIG. 26 is a process cross-sectional view for explaining a method of fabricating a semiconductor device according to a related art (No. 1).
Figure 27:
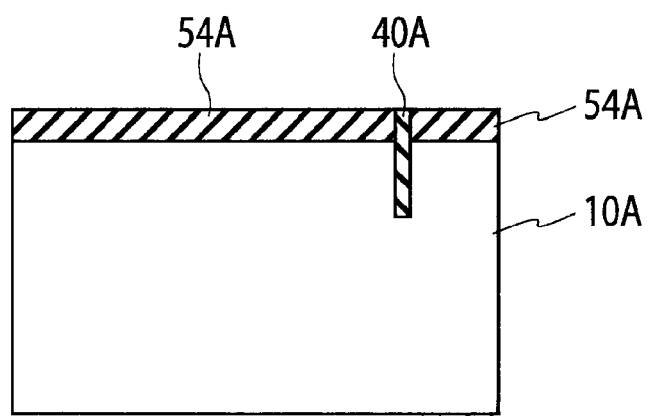
FIG. 27 is a process cross-sectional view for explaining the method of fabricating a semiconductor device according to the related art (No. 2).

According to the method of fabricating a semiconductor device according to the embodiment of the present invention, the movable electrode 21 and fixed electrodes 30 can be made thicker than those according to the related art which forms the isolation region by forming a separation groove 400 in the surface of a semiconductor substrate 10A using an upper insulating film 54A as an etching mask and filling the separation groove 400 with an insulating material 40A as shown in FIGS. 26 and 27, for example. Accordingly, the limitation on the sensitivity of the MEMS device due to the isolation region is prevented. It is therefore possible to provide a semiconductor device with high detection sensitivity.

Furthermore, in the semiconductor device in which a part of the semiconductor substrate 10 is used as each separation column 401, there is no void formed within the isolation region 40 unlike the case of forming the isolation region by filling the grooves with an insulating material. Accordingly, the isolation regions 40 have high mechanical strength and provide higher reliability.

Moreover, in the case of forming the isolation region by filling the grooves with the insulating film, the insulating film needs to be thick so that no void is formed within the groove. Accordingly, the side insulating film is made thick in the case of simultaneously performing the step of filling the isolation region with the insulating film and the step of forming the side insulating film on the movable portion and fixed electrodes. On the other hand, the separation insulating film 402 of the semiconductor device according to the embodiment of the present invention has a thickness of about 0.1 to 0.3 μm as described above, for example. The movable electrode 21 and fixed electrodes 30 can be therefore arranged close to each other, thus increasing the detection sensitivity.

FIRST MODIFICATION

With reference to FIGS. 28 to 39, a description is given of another method of fabricating a semiconductor device according to the embodiment of the present invention, the semiconductor device including the movable electrode 21 and fixed electrodes 30 electrically separated from the supporting body 70 by the isolation regions 40, which are each composed of the separation column 401 and separation insulating film 402. FIGS. 28 to 39 show cross-sectional views corresponding to the position taken along the line I-I of FIG. 1A.

Figure 28:
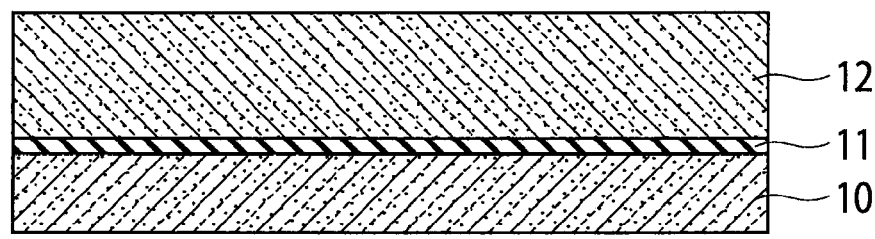
FIG. 28 is a process view for explaining a first modification of the method of fabricating a semiconductor device according to the embodiment of the present invention (No. 1).

(a) A laminate including the semiconductor substrate 10, an insulator layer 11, and a semiconductor layer 12 stacked on each other as shown in FIG. 28 is prepared. For example, the prepared laminate has an SOI structure including the semiconductor substrate 10 of a Si substrate, the insulator layer 11 of an $SiO_2$ film, and the semiconductor layer 12 of a polysilicon film. The materials of the semiconductor substrate 10 and semiconductor layer 12 can be selected from general semiconductor materials including compounds such as SiC, SiGe, and GaN. As described later, the movable portion 20 and fixed electrodes 30 are formed by processing the semiconductor layer 12. The thickness of the semiconductor layer 12 is set to a thickness required by the movable portion 20 and fixed electrodes 30, which is about 30 to 100 μm, for example. A part of the insulator layer 11 is used as the lower insulating film 50. The insulator layer 11 can be made of $SiO_2$ film, SiN film, or a laminate of $SiO_2$ film and SiN film, which has a thickness of about 0.1 to 2.0 μm, for example.

Figure 29:
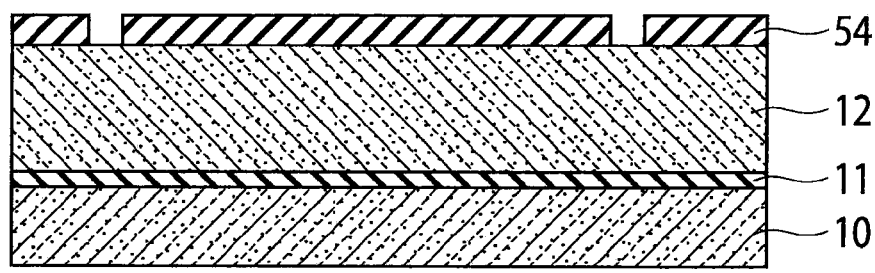
FIG. 29 is a process view for explaining the first modification of the method of fabricating a semiconductor device according to the embodiment of the present invention (No. 2).

(b) The upper insulating film 54 is formed on the semiconductor layer 12 using thermal oxidation or CVD. The upper insulating film 54 can be made of $SiO_2$ film or the like having a thickness of 0.5 to 4.0 μm, for example. The upper insulating film 54 is patterned using photolithography, etching, and the like. As shown in FIG. 29, the portion of the upper insulating film 54 where the separation columns 401 are to be formed are removed. The portion of the upper insulating film 54 where the contact electrode 80 is to be formed is also removed.

Figure 30:
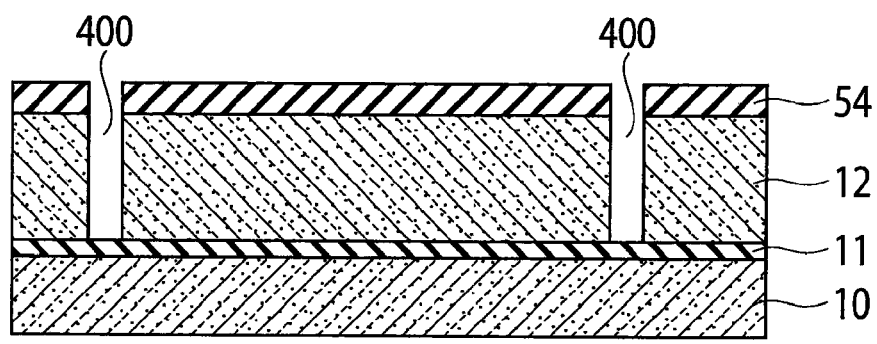
FIG. 30 is a process view for explaining the first modification of the method of fabricating a semiconductor device according to the embodiment of the present invention (No. 3).
Figure 31:
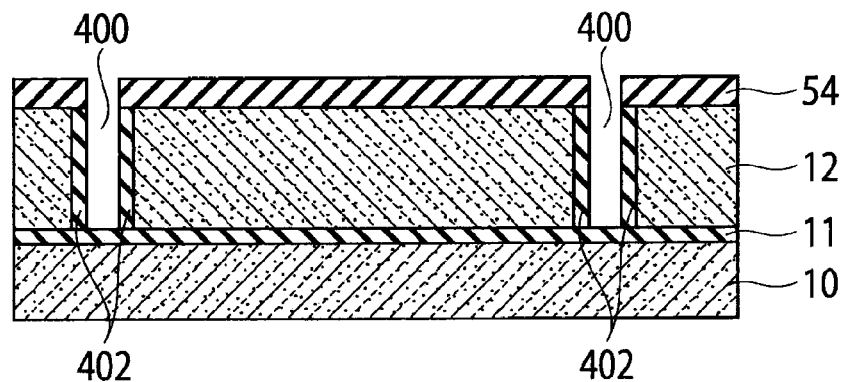
FIG. 31 is a process view for explaining the first modification of the method of fabricating a semiconductor device according to the embodiment of the present invention (No. 4).
Figure 32:
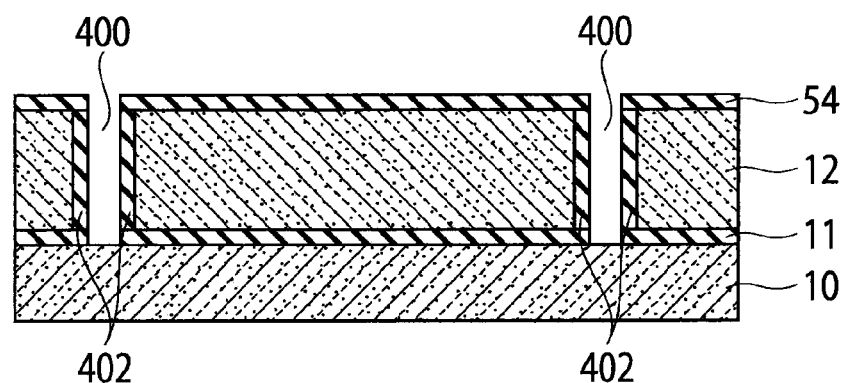
FIG. 32 is a process view for explaining the first modification of the method of fabricating a semiconductor device according to the embodiment of the present invention (No. 5).

(c) As shown in FIG. 30, the semiconductor layer 12 is partially etched using the upper insulating film 54 as a mask to expose the surface of the insulator layer 11, thus forming the separation grooves 400. The etching of the semiconductor layer 12 can be the Bosch process using D-RIE, wet etching, or the like. As shown in FIG. 31, the separation insulating film 402 is then formed on the surface of each separation groove 400. Thereafter, as shown in FIG. 32, the portion of the insulator layer 11 exposed at the bottom surfaces of the separation grooves 400 are removed by anisotropic etching, for example.

Figure 33:
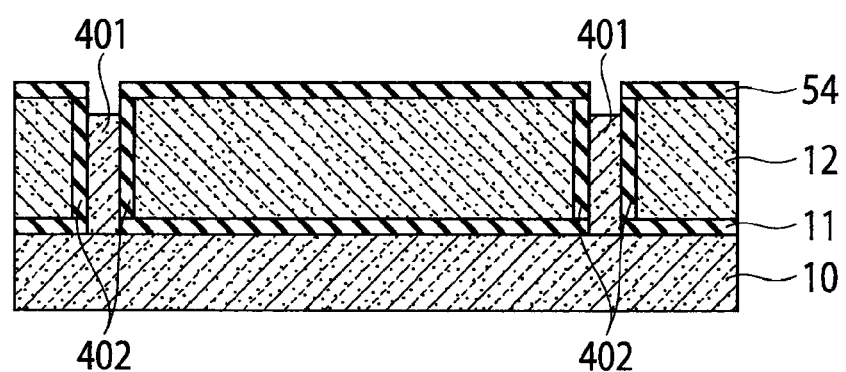
FIG. 33 is a process view for explaining the first modification of the method of fabricating a semiconductor device according to the embodiment of the present invention (No. 6).
Figure 34:
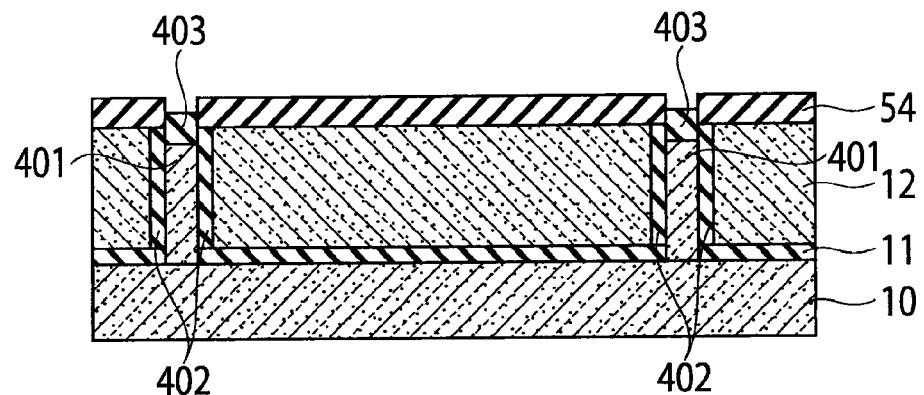
FIG. 34 is a process view for explaining the first modification of the method of fabricating a semiconductor device according to the embodiment of the present invention (No. 7).

(d) As shown in FIG. 33, the separation grooves 400 are filled with a semiconductor film by epitaxial selective growth or the like to form the separation columns 401. The contact electrode 80, which is not shown, is formed at the same time. Thereafter, as shown in FIG. 34, insulating film is formed on the surface of the semiconductor base, thus making the upper insulting film 54 thick and forming the insulating film 403 on the top surface of each separation column 401.

Figure 35:
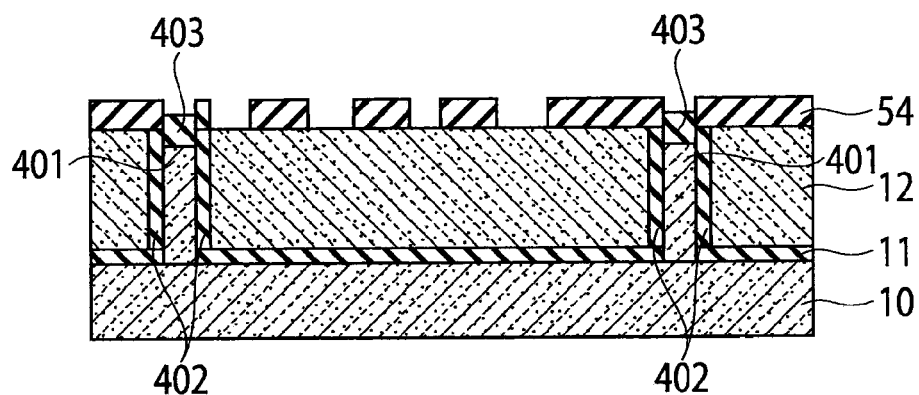
FIG. 35 is a process view for explaining the first modification of the method of fabricating a semiconductor device according to the embodiment of the present invention (No. 8).

(e) As shown in FIG. 35, the upper insulating film 54 is selectively etched using photolithography and the like into a desired pattern. To be specific, the upper insulating film 54 is removed excepting the portion on the regions where the movable portion 20, fixed electrodes 30, isolation regions 40, supporting body 70, and contact electrode 80 are to be formed.

Figure 36:
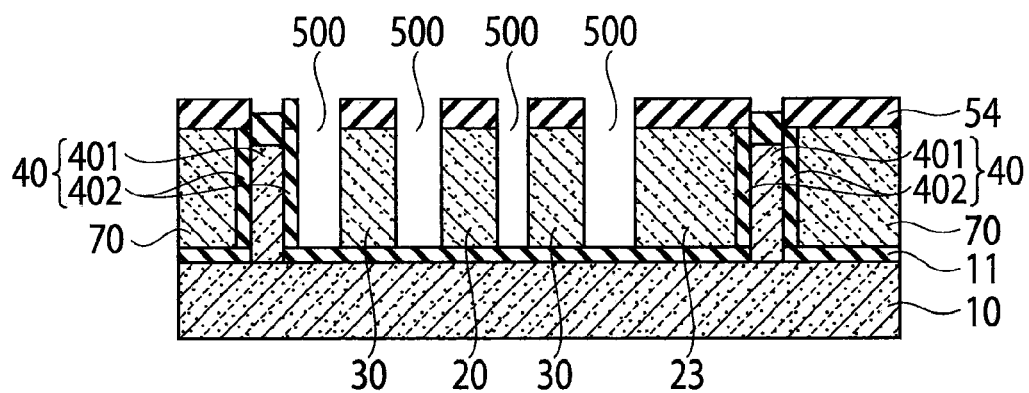
FIG. 36 is a process view for explaining the first modification of the method of fabricating a semiconductor device according to the embodiment of the present invention (No. 9).

As shown in FIG. 36, then, the semiconductor layer 12 is partially etched and removed using the upper insulating film 54 as the etching mask to form the side grooves 500. The movable portion 20 and fixed electrodes 30, which are composed of the portion of the semiconductor layer 12 provided in the center of the semiconductor substrate 10, are connected to the supporting body 70, which is composed of the portion of the semiconductor layer 12 provided on the periphery of the semiconductor substrate 10.

Figure 37:
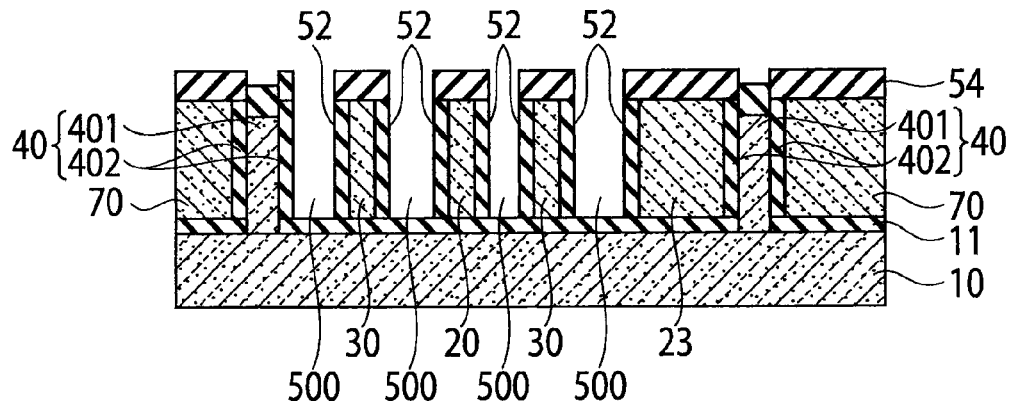
FIG. 37 is a process view for explaining the first modification of the method of fabricating a semiconductor device according to the embodiment of the present invention (No. 10).

(f) As shown in FIG. 37, the side insulating films 52 are formed on the side surfaces of the movable portion 20 and fixed electrodes 30 exposed in the side grooves 500. Each side insulating film 52 is an insulating film such as a $SiO_2$ film or a SiN film which has a thickness of 0.1 to 1 μm. The side insulating films 52 can be formed using thermal oxidation or CVD. The top view of the semiconductor device corresponding to the cross-sectional view of FIG. 37 is the same as FIG. 8A.

Figure 38:
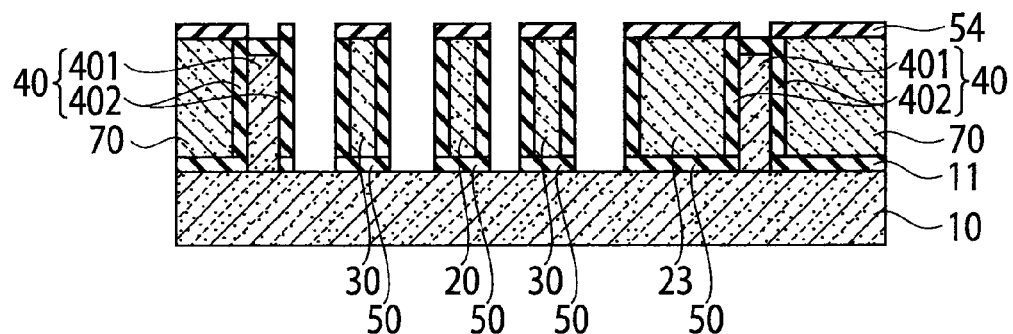
FIG. 38 is a process view for explaining the first modification of the method of fabricating a semiconductor device according to the embodiment of the present invention (No. 11).

(g) The portion of the insulator layer 11 exposed at the bottom of each side groove 500 is then removed by anisotropic etching. As shown in FIG. 38, the surface of the semiconductor substrate 10 is thus exposed at the bottom of each side groove 500. On the other hand, on the bottom surface of each of the movable portion 20 and fixed electrodes 30, the insulator layer 11 partially remains as the lower insulating film 50.

Figure 39:
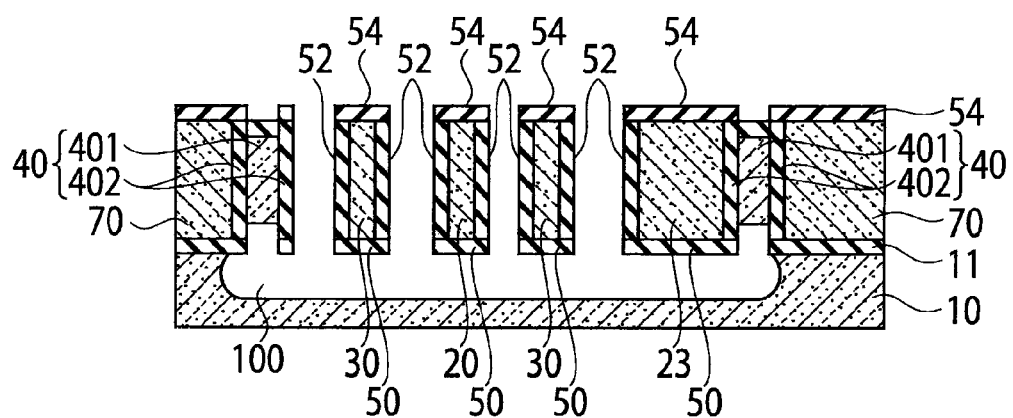
FIG. 39 is a process view for explaining the first modification of the method of fabricating a semiconductor device according to the embodiment of the present invention (No. 12).

(h) As shown in FIG. 39, upper part of the semiconductor substrate 10 is partially etched by isotropic etching using the side insulating films 52 and lower insulating films 50 as a mask (release etching), thus forming the recess portion 100. The release etching separates the movable portion 20 and fixed electrodes 30 from the semiconductor substrate 10, thus providing the movable portion 20 and fixed electrodes 30 above the recess portion 100. In this manner, the semiconductor device according to the embodiment of the present invention is thus completed.

The opening portions 600, 610, 620, and 630 are formed in the same way as the method described with reference to FIGS. 10A and 10B before the release etching described with reference to FIG. 39 (not described above). The electrode wire 61 connected to the movable portion 20 through the opening portion 610, the electrode wires 62 connected to the fixed electrodes 30 through the opening portions 630, and the electrode wire 63 connected to the supporting body 70 through the opening portion 630 and to the contact electrode 80 through the opening portion 600 are formed in the same way as the method described with reference to FIGS. 11A and 11B.

The release etching may be terminated before the bottom of the separation column 401 of the isolation region 40 electrically separating the movable electrode 21 from the supporting body 70 is disconnected from the semiconductor substrate 10, thus providing the recess portion 100 with the separation column 401 being connected to the semiconductor substrate 10 in a similar manner to FIGS. 24 and 25.

As described above, the semiconductor device according to the embodiment of the present invention can be fabricated according to the fabricating method described with reference to FIGS. 28 to 39. The method of fabricating a semiconductor device according to the first modification described above differs from the fabricating method described with reference to FIGS. 4A and 4B to FIGS. 11A and 11B in that: the laminate including the semiconductor substrate 10, insulator layer 11, and semiconductor layer 12 stacked on each other is used and the supporting body 70 is formed using the semiconductor layer 12; a part of the insulator layer 11 is used as the lower insulating film 50; the separation columns 401 are selectively grown on the semiconductor substrate 10; and the like.

SECOND MODIFICATION

With reference to FIGS. 40 to 55, a description is given below of still another method of fabricating the semiconductor device according to the embodiment of the present invention. FIGS. 40 to 55 are cross-sectional views corresponding to the position along the line I-I of FIG. 1A.

Figure 40:
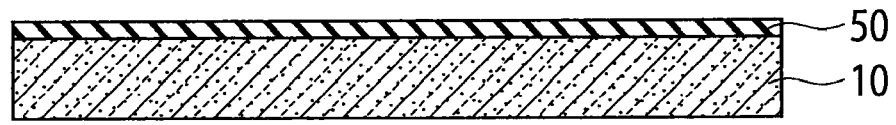
FIG. 40 is a process view for explaining a second modification of the method of fabricating a semiconductor device according to the embodiment of the present invention (No. 1).

(a) As shown in FIG. 40, the lower insulating film 50 is formed on the upper surface of the semiconductor substrate 10 using thermal oxidation, CVD, or the like. The semiconductor substrate 10 is a Si substrate or the like. The lower insulating film 50 is a $SiO_2$ film or the like with a thickness of about 0.5 to 2.0 μm, for example.

Figure 41:
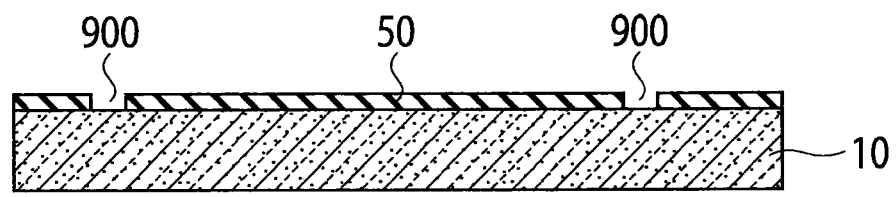
FIG. 41 is a process view for explaining the second modification of the method of fabricating a semiconductor device according to the embodiment of the present invention (No. 2).
Figure 42:
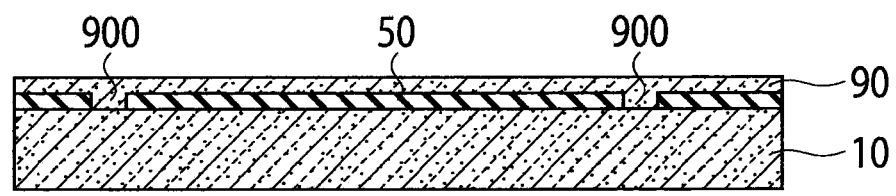
FIG. 42 is a process view for explaining the second modification of the method of fabricating a semiconductor device according to the embodiment of the present invention (No. 3).
Figure 43:
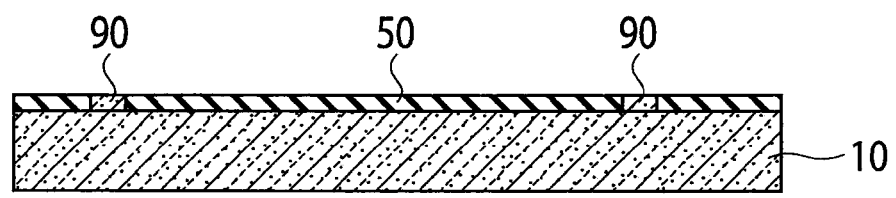
FIG. 43 is a process view for explaining the second modification of the method of fabricating a semiconductor device according to the embodiment of the present invention (No. 4).

(b) The portion of the lower insulating film 50 where the separation columns 401 are to be formed are removed to form grooves 900 as shown in FIG. 41. The portion of the lower insulating film 50 where the contact electrode 80 is to be formed is also removed, which is not shown. Subsequently, the grooves 900 are filled with a semiconductor film. For example, as shown in FIG. 42, a contact film 90 of polysilicon is deposited on the lower insulating film 50 so as to fill the grooves 900. Thereafter, the upper part of the contact film 90 is etched by CMP or the like until the surface of the lower insulating film 50 is exposed as shown in FIG. 43. As described later, one of the contact films 90 electrically connects the contact electrode 80 to the semiconductor substrate 10.

Figure 44:
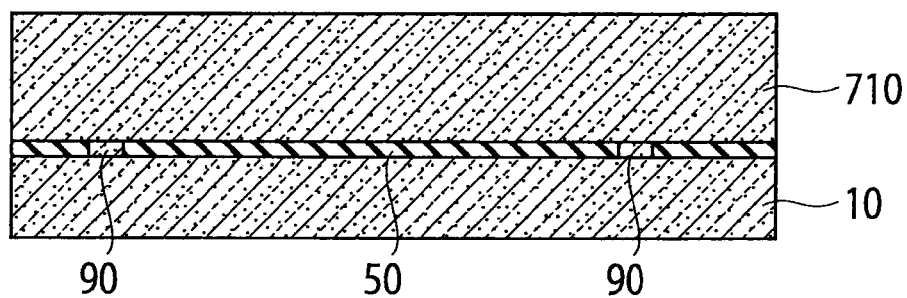
FIG. 44 is a process view for explaining the second modification of the method of fabricating a semiconductor device according to the embodiment of the present invention (No. 5).
Figure 45:
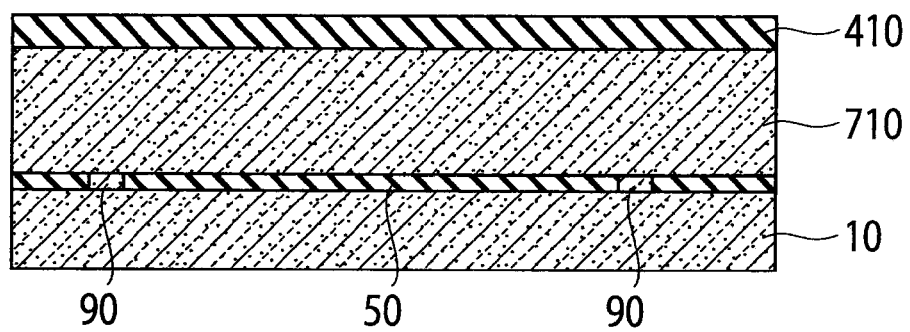
FIG. 45 is a process view for explaining the second modification of the method of fabricating a semiconductor device according to the embodiment of the present invention (No. 6).
Figure 46:
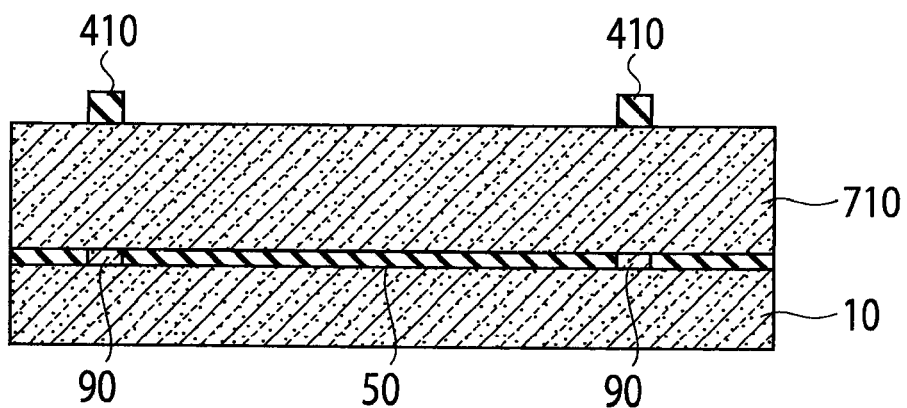
FIG. 46 is a process view for explaining the second modification of the method of fabricating a semiconductor device according to the embodiment of the present invention (No. 7).

(c) As shown in FIG. 44, a bonding semiconductor substrate 710 is bonded to the lower insulating film 50 and contact films 90. The bonding semiconductor substrate 710 can be a Si substrate or the like. Subsequently, the insulating film 410 is formed on the surface of the bonding semiconductor substrate 710 using thermal oxidation, CVD, or the like as shown in FIG. 45. The insulating film 410 can be a $SiO_2$ film or the like, for example.

Figure 47:
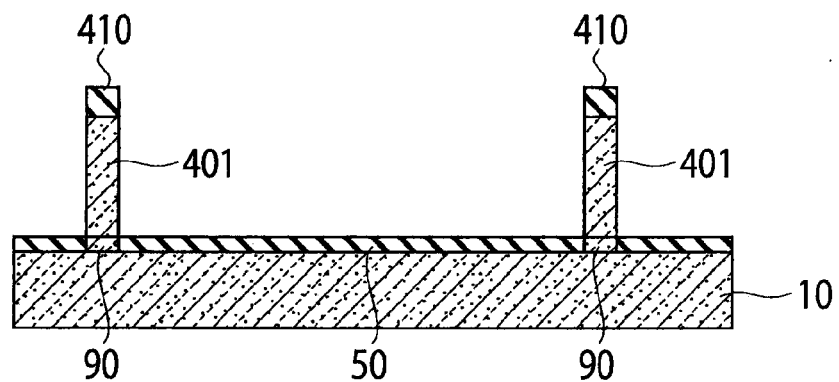
FIG. 47 is a process view for explaining the second modification of the method of fabricating a semiconductor device according to the embodiment of the present invention (No. 8).

(d) The insulating film 410 is patterned using photolithography, etching, and the like so that the portion of the insulating film 410 where the separation columns 410 are to be formed remain. In short, the positions where the insulating film 410 is left correspond to the positions where the grooves 900 are formed. Subsequently, upper part of the bonding semiconductor substrate 710 is partially etched using the insulating film 41 as a mask until the lower insulating film 50 is exposed to form the separation columns 401 made of a semiconductor is formed as shown in FIG. 47. The separation columns 401 are connected to the semiconductor substrate 10 through the contact films 90. At this time, the contact electrode 80 is formed in a similar manner to the separation columns 401 (not shown) and is connected to the semiconductor substrate 10 through the contact film 90. For example, the heights of the separation columns 401 and the contact electrode 80 are about 30 to 100 μm, and the widths thereof are several μm. The etching of the bonding semiconductor substrate 710 can be the Bosch process using D-RIE, wet etching, and the like.

Figure 48:
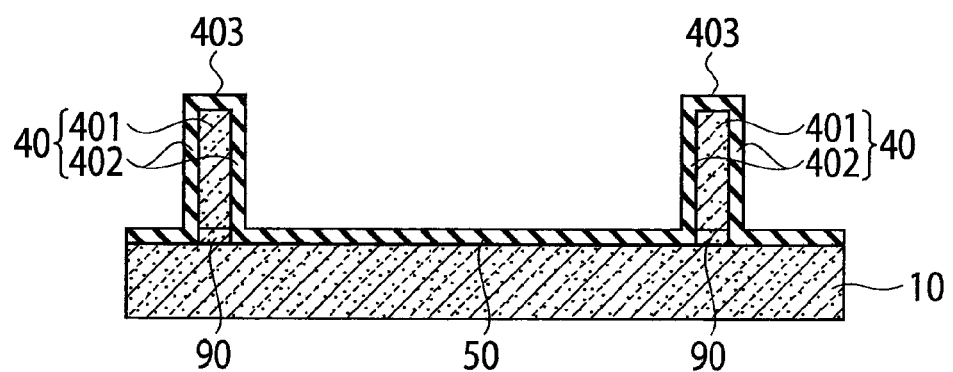
FIG. 48 is a process view for explaining the second modification of the method of fabricating a semiconductor device according to the embodiment of the present invention (No. 9).

(e) After the insulating films 410 are removed, an insulating film is formed on the surfaces of the separation columns 401 and contact electrode 80 using thermal oxidation, CVD, or the like. Specifically, as shown in FIG. 48, the insulating film 403 is formed on the top surface of each separation column 401, and the separation insulating film 402 is formed on the side surface of each separation column 401. The separation insulating film 402 is also formed on the side surface of the contact electrode 80, which is not shown. The thickness of the separation insulating films is about 0.1 to 0.3 μm, for example.

Figure 49:
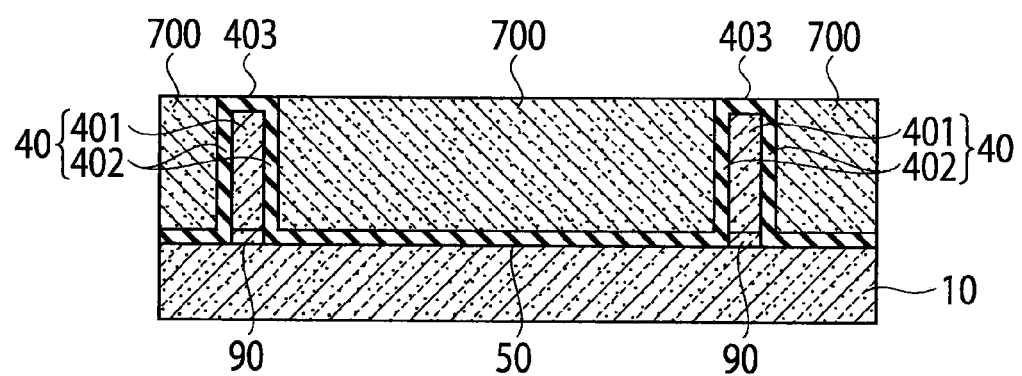
FIG. 49 is a process view for explaining the second modification of the method of fabricating a semiconductor device according to the embodiment of the present invention (No. 10).

(f) The burying semiconductor film 700 is formed on the lower insulating film 50 to bury the isolation regions 40, each of which is composed of the separation column 401 and separation insulating film 402, and the contact electrode 80 within the burying semiconductor film 700. For example, the burying semiconductor film 700 is formed by depositing polysilicon film on the semiconductor substrate 10 by epitaxial growth or the like, for example. As shown in FIG. 49, the upper part of the burying semiconductor film 700 is etched by CMP or the like until the surfaces of the insulating films 403 provided on the separation columns 401 are exposed.

Figure 50:
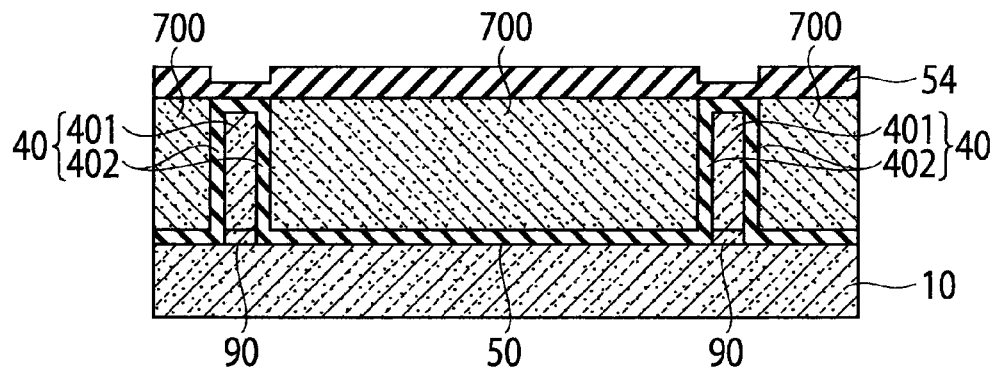
FIG. 50 is a process view for explaining the second modification of the method of fabricating a semiconductor device according to the embodiment of the present invention (No. 11).

(g) As shown in FIG. 50, the upper insulating film 54 is formed on the burying semiconductor film 700. The upper insulating film 54 can be a $SiO_2$ film or a laminate of a $SiO_2$ film and a SiN film with a thickness of about 0.5 to 4.0 μm, for example.

Figure 51:
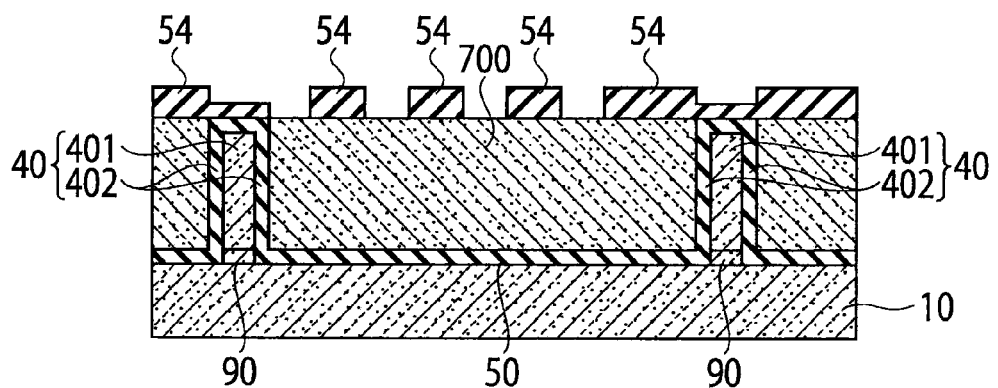
FIG. 51 is a process view for explaining the second modification of the method of fabricating a semiconductor device according to the embodiment of the present invention (No. 12).
Figure 52:
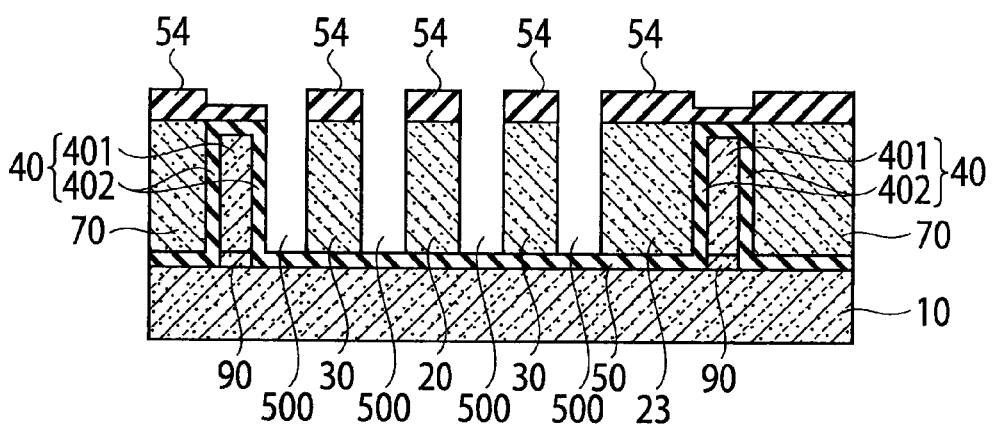
FIG. 52 is a process view for explaining the second modification of the method of fabricating a semiconductor device according to the embodiment of the present invention (No. 13).
Figure 53:
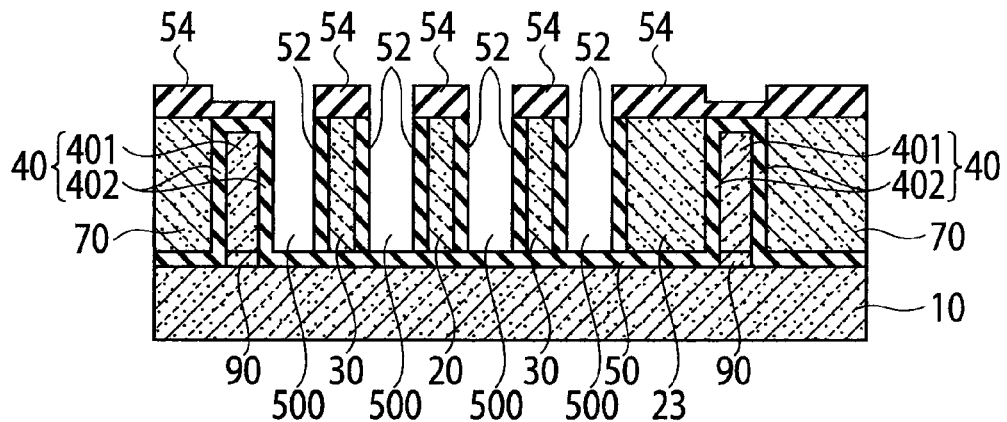
FIG. 53 is a process view for explaining the second modification of the method of fabricating a semiconductor device according to the embodiment of the present invention (No. 14).

(h) As shown in FIG. 51, the upper insulating film 54 is selectively etched into a desired pattern. To be specific, the upper insulating film 54 is left on the regions where the movable portion 20, fixed electrodes 30, isolation regions 40, supporting body 70, and contact electrode 80 are to be formed. The burying semiconductor film 700 is partially etched and removed using the patterned upper insulating film 54 as an etching mask, forming the side grooves 500 in which the side surfaces of the movable portion 20 and fixed electrodes 30 are exposed as shown in FIG. 52. As shown in FIG. 53, the side insulating films 52 are formed on the surfaces of the side grooves 500, or the side surfaces of the movable portion 20 and fixed electrodes 30. Each side insulating film 52 is an insulating film such as a $SiO_2$ film or a SiN film with a thickness of about 0.1 to 1.0 μm, for example. The side insulating films 52 can be formed by thermal oxidation or CVD. With the aforementioned process, the movable portion 20 and fixed electrodes 30, each of which is composed of a portion of the burying semiconductor film 700, are connected to the supporting body 70, which is a portion of the burying semiconductor film 700 on the periphery of the semiconductor substrate, through the isolation regions 40.

Figure 54:
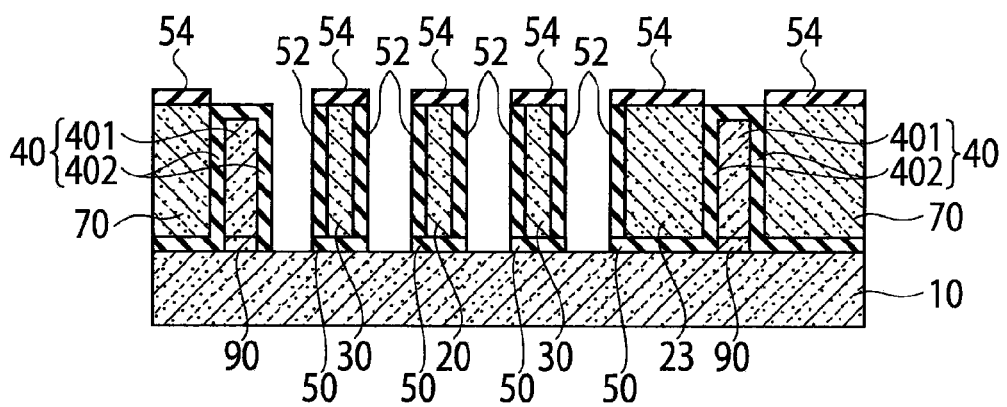
FIG. 54 is a process view for explaining the second modification of the method of fabricating a semiconductor device according to the embodiment of the present invention (No. 15).

(i) The portion of the lower insulating film 50 exposed at the bottom of each side groove 500 is removed by anisotropic etching. The surface of the semiconductor substrate 10 is therefore exposed at the bottom of each side groove 500 as shown in FIG. 54. On the other hand, the lower insulating film 50 remains on the bottom surfaces of the movable portion 20, fixed electrodes 30, and contact electrode 80.

Figure 55:
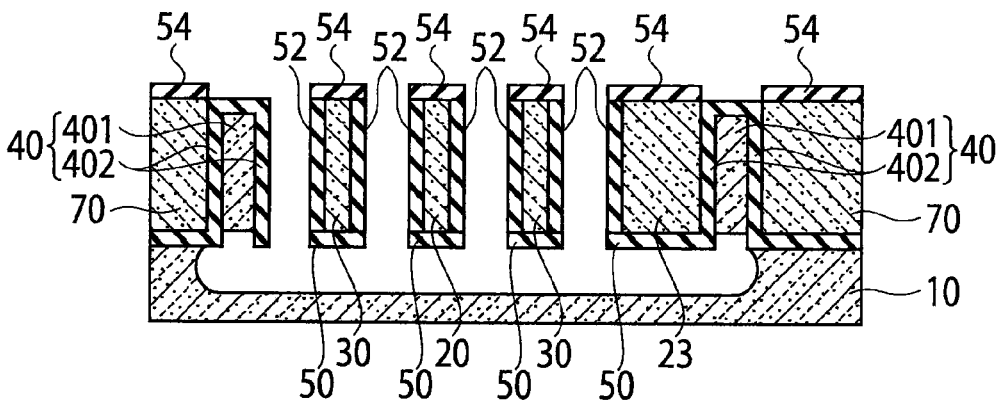
FIG. 55 is a process view for explaining the second modification of the method of fabricating a semiconductor device according to the embodiment of the present invention (No. 16).

(j) The upper portion of the semiconductor substrate 10 is partially isotropically etched (release etching) using the side insulating films 52 and lower insulating film 50 as a mask, thus forming the recess portion 100. As shown in FIG. 55, this release etching separates the movable portion 20 and fixed electrodes 30 from the semiconductor substrate 10 and exposes the lower insulating film 50 provided on the bottom surfaces of the movable portion 20 and fixed electrodes 30. The movable portion 20 and fixed electrodes 30 are provided above the recess portion 100. At this time, the contact films 90 provided on the bottom surfaces of the separation columns 401 are etched and removed, but the contact film 90 provided on the bottom surface of the contact electrode 80 is not etched. Accordingly, the contact electrode 80 and semiconductor substrate 10 are electrically connected through the contact film 90. In such a manner, the semiconductor device according to the embodiment of the present invention is completed.

The opening portions 600, 610, 620, and 630 are formed in the same way as the method described with reference to FIGS. 10A and 10B before the release etching described with reference to FIG. 55, but is not described above. The electrode wire 61 connected to the movable portion 20 through the opening portion 610, the electrode wires 62 connected to the fixed electrodes 30 through the opening portions 630, and the electrode wire 63 connected to the supporting body 70 through the opening portion 630 and connected to the contact electrode 80 through the opening portion 600 are formed in the same way as the method described with reference to FIGS. 11A and 11B.

The release etching is terminated before the bottom of the separation column 401 of the isolation region 40 electrically separating the movable electrode 21 and supporting body 70 is separated from the semiconductor substrate 10 so that the recess portion 100 is formed with the separation column 401 being connected to the semiconductor substrate 10 in a similar manner to FIGS. 24 and 25. In this case, the separation columns 401 and semiconductor substrate 10 are electrically connected through the contact films 90.

As described above, the method of fabricating a semiconductor device according to the second modification described above differs from the fabricating method described with reference to FIGS. 4A and 4B to FIGS. 11A and 11B in that the separation columns 401 are formed using the bonding semiconductor substrate 710 in addition to the semiconductor substrate 10. The semiconductor device according to the embodiment of the present invention can be fabricated according to the fabricating method described with reference to FIGS. 40 to 55. In the semiconductor device according to the embodiment of the present invention, the movable electrode 21 and the fixed electrodes 30 are electrically separated from the supporting body 70 by the isolation regions 40, each of which includes the separation column 401 and the separation insulating film 402.

OTHER EMBODIMENTS

As described above, the present invention is described using the embodiment of the present invention, but it should not be understood that the present invention is limited by the description and drawings constituting a part of the disclosure. Those skilled in the art will know various substitutions, examples, and operational techniques from the disclosure.

The explanation of the embodiment described above shows the example where the semiconductor device is an acceleration sensor. However, the present invention is not limited to the acceleration sensor and can be applied to various sensors detecting physical amounts using a structure displaced by external force and the like. The present invention can be applied to angular speed sensors, pressure sensors, force sensors, and the like, for example.

It is obvious that the present invention includes various embodiments not described in the specification. Accordingly, the technical scope of the present invention is determined only by the features of the invention according to the claims proper from the above description.

INDUSTRIAL APPLICABILITY

The semiconductor device of the present invention is applicable in electronics industries including manufacturing business fabricating semiconductor sensors including movable portions.

REFERENCE SIGNS LIST

10 . . . SEMICONDUCTOR SUBSTRATE
11 . . . INSULATOR LAYER
12 . . . SEMICONDUCTOR LAYER
20 . . . MOVABLE PORTION
20T . . . TEST MOVABLE PORTION
21, 21T . . . MOVABLE ELECTRODE
22, 22T . . . SPRING PORTION
23, 23T . . . FIXED PORTION
30 . . . FIXED ELECTRODE;
30T . . . TEST FIXED ELECTRODE;
40 . . . ISOLATION REGION;
50 . . . LOWER INSULATING FILM;
52 . . . SIDE INSULATING FILM;

54 ... UPPER INSULATING FILM;
61, 61T, 62, T62, 63 ... ELECTRODE WIRE;
70 ... SUPPORTING BODY;
80 ... CONTACT ELECTRODE;
90 ... CONTACT FILM;
100 ... RECESS PORTION;
400 ... SEPARATION GROOVE;
401 ... SEPARATION COLUMN;
402 ... SEPARATION INSULATING FILM;
403 ... INSULATING FILM;
410 ... INSULATING FILM;
500 ... SIDE GROOVE;
600, 601, 610, 620, 630 ... OPENING PORTION;
700 ... SEMICONDUCTOR FILM;
710 ... BONDING SEMICONDUCTOR SUBSTRATE;
900 ... GROOVE

What is claimed is:

1. A semiconductor device comprising:
a semiconductor substrate with a recess portion formed in an upper surface;
a supporting body provided around the recess portion on the semiconductor substrate;
a beam-type movable portion which includes a movable electrode provided above the recess portion and is fixed to the supporting body at a position away from the movable electrode;
a beam-type fixed electrode provided above the recess portion to be opposed to the movable electrode and fixed to the supporting body; and
isolation regions each including a respective separation column made of a semiconductor and a separation insulating film provided on a side surface of the separation column, the isolation regions being provided between the movable electrode and the supporting body and between the fixed electrode and the supporting body to electrically separate the movable and fixed electrodes from the supporting body,
wherein the semiconductor substrate and the separation columns have a same crystal orientation, and
wherein the separation column of the isolation region separating the movable electrode from the supporting body is connected to the semiconductor substrate, and the separation insulating film is continuously provided on side and top surfaces of a corresponding one of the separation columns and on a top surface of the semiconductor substrate.

2. The semiconductor device according to claim 1, wherein a portion connecting the movable portion and the supporting body is composed of a flexible spring.

3. The semiconductor device according to claim 1, wherein the movable electrode and the fixed electrode are interdigitated.

4. The semiconductor device according to claim 1, further comprising:
a contact electrode connected to the semiconductor substrate at the bottom of the contact electrode and is electrically connected to the supporting body at the top thereof 5. The semiconductor device according to claim 4, wherein the semiconductor substrate and the contact electrode have a same crystal orientation.

* * * * *